United States Patent
Xia et al.

(10) Patent No.: US 11,382,224 B2
(45) Date of Patent: Jul. 5, 2022

(54) HERMETICALLY SEALED ELECTRONIC PACKAGES WITH ELECTRICALLY POWERED MULTI-PIN ELECTRICAL FEEDTHROUGHS

(71) Applicant: PA&E, Hermetic Solutions Group, LLC, Wenatchee, WA (US)

(72) Inventors: Hua Xia, Wenatchee, WA (US); Nathan Foster, Wenatchee, WA (US); Nelson Settles, East Wenatchee, WA (US); Steve Hall, Cashmere, WA (US); David DeWire, Superior, CO (US)

(73) Assignee: PA&E, HERMETIC SOLUTIONS GROUP, LLC, Wenatchee, WA (US)

( * ) Notice: Subject to any disclaimer, the term of this patent is extended or adjusted under 35 U.S.C. 154(b) by 126 days.

(21) Appl. No.: 17/028,274

(22) Filed: Sep. 22, 2020

(65) Prior Publication Data
US 2021/0014986 A1     Jan. 14, 2021

Related U.S. Application Data

(63) Continuation-in-part of application No. 16/285,635, filed on Feb. 26, 2019, now Pat. No. 10,811,331.

(51) Int. Cl.
*H01L 23/31*     (2006.01)
*H05K 5/00*     (2006.01)
(Continued)

(52) U.S. Cl.
CPC ........... *H05K 5/0095* (2013.01); *C22C 26/00* (2013.01); *C22C 29/005* (2013.01);
(Continued)

(58) Field of Classification Search
CPC ... H01L 23/3142; H01L 23/045; H01L 23/26; H01L 23/3733
See application file for complete search history.

(56) References Cited

U.S. PATENT DOCUMENTS 4,445,744 A * 5/1984 Sedig ................... H01R 13/521
    439/271
5,017,740 A * 5/1991 Honkomp ............ H01B 17/305
    337/273

(Continued)

*Primary Examiner* — Douglas M Menz
(74) *Attorney, Agent, or Firm* — Patentfile, LLC; Bradley C. Fach; Steven R. Kick

(57) ABSTRACT

A hermetically sealed electronic package may include a thermal panel having a panel interior surface and a panel exterior surface with electronic device(s) in thermal communication with the panel interior surface. An enclosure, isolating environmental communication from internal electronic devices and modules, may be coupled to the thermal panel, and the enclosure may have an enclosure interior surface and an enclosure exterior surface. A plurality of electrical feedthroughs may be coupled to the package enclosure for signal and data transmission, and the conducting pin(s) in every electrical feedthrough may be bonded by a hydrophobic sealing material for harsh environmental electrical signal, data and power transmission. The ratio of sealing length over sealing bead diameter in the electrical feedthrough subassembly may have a preferred value from 2 to 3; and the ratio of the sealing bead diameter over pin diameter in the electrical feedthrough subassembly may have a preferred value from 1.5 to 2.0, where a preferred thermal stress resistance could be designed for making highly hermetic sealed electronic package.

14 Claims, 18 Drawing Sheets

(51) Int. Cl.

| | |
|---|---|
| *H05K 5/04* | (2006.01) |
| *C22C 29/00* | (2006.01) |
| *C22C 26/00* | (2006.01) |
| *C22C 29/06* | (2006.01) |
| *H05K 7/20* | (2006.01) |

(52) U.S. Cl.
CPC ............. *C22C 29/065* (2013.01); *H05K 5/04* (2013.01); *H05K 7/2039* (2013.01)

(56) References Cited

U.S. PATENT DOCUMENTS

| | | | | |
|---|---|---|---|---|
| 5,424,573 | A * | 6/1995 | Kato | H01L 31/0203 257/116 |
| 6,278,400 | B1 * | 8/2001 | Cassen | G01S 7/03 342/372 |
| 6,355,362 | B1 * | 3/2002 | Jones | H05K 7/20445 428/614 |
| 6,957,981 | B2 * | 10/2005 | Karino | H01R 13/5845 439/606 |
| 7,168,984 | B2 * | 1/2007 | Perle | H01R 13/5845 439/606 |
| 7,364,451 | B2 * | 4/2008 | Ring | H01R 13/5216 439/271 |
| 7,901,247 | B2 * | 3/2011 | Ring | H01R 13/533 439/606 |
| 8,082,663 | B1 * | 12/2011 | Monroe | C03C 10/00 29/877 |
| 9,553,398 | B2 * | 1/2017 | True | H01R 13/521 |
| 2005/0060003 | A1 * | 3/2005 | Taylor | A61N 1/3754 607/36 |

* cited by examiner

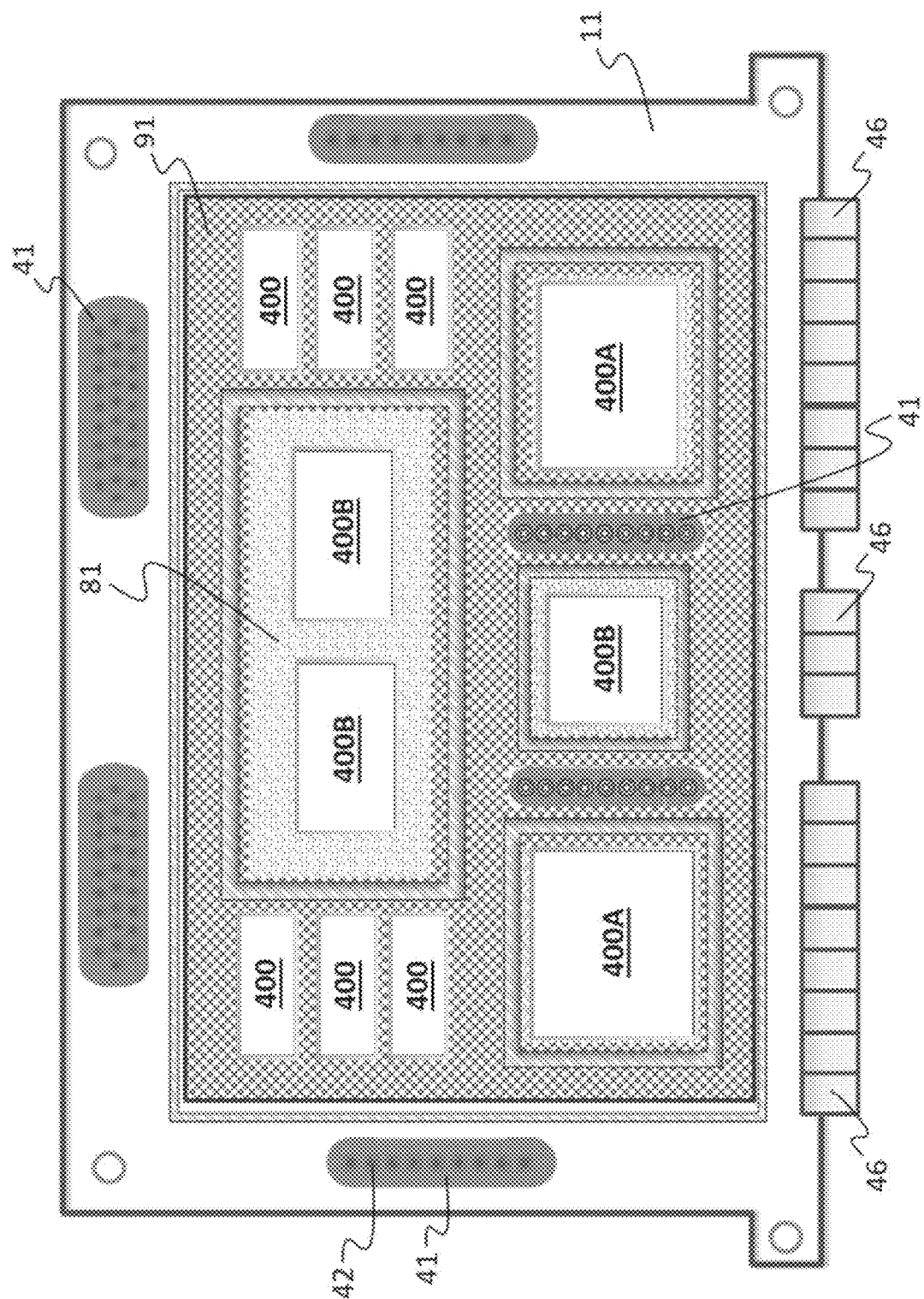

Table 1: Table of Material Properties

| Material Properties | Ti-alloy | Al-alloy | Sealant | BeCu | Alloy 52 | CrCu |
|---|---|---|---|---|---|---|
| Density (kg/m³) | 4510 | 2680 | 5730 | 8350 | 8460 | 8890 |
| Young modulus (GPa) | 106-1.087E-1T | 78.8-3.2E-3T | 76 | 129.33+9.56E-2T | 160 | 118-0.04T |
| Coefficient of thermal expansion (ppm/°C) | 8.4691+0.0045T | 18.58+1.634E-02T | 7.5 | 17.6+8.0E-3T | 11.26-6.981E-3T | 16.90+0.01T |
| Poisson's ratio | 0.33 | 0.34 | 0.30 | 0.27 | 0.29 | 0.181 |
| Maximum compressive strength (MPa) | --- | --- | 680 | 970 | --- | --- |
| Maximum tensile strength (MPa) | 1000 | 380 | 65 | 1170 | 540 | 380 |
| Thermal conductivity (W/m·K) | 22 | 140-155 | 1.4 | 115 | 14 | 323 |
| Glass transition temperature (°C) | --- | --- | 440 | --- | --- | --- |
| Electrical resistivity (Ω-cm) at 0°C | 5.50E-07 | 5.00E-08 | 1.50E+19 | 7.00E-08 | 4.40E-07 | 3.82E-08 |

FIG. 13

HERMETICALLY SEALED ELECTRONIC PACKAGES WITH ELECTRICALLY POWERED MULTI-PIN ELECTRICAL FEEDTHROUGHS

CROSS REFERENCE TO RELATED APPLICATIONS

This application claims priority to and is a continuation-in-part of co-pending U.S. application Ser. No. 16/285,635, filed on Feb. 26, 2019, entitled "HERMETICALLY SEALED ELECTRONIC PACKAGES WITH ELECTRICALLY POWERED MULTI-PIN ELECTRICAL FEEDTHROUGHS", which is hereby incorporated by reference in its entirety.

FIELD OF THE INVENTION

This patent specification relates to thermal and stress managements on hermetically sealed electronic packages in general, and more specifically, on the hermetically sealed electronic packages with electrically powered multi-pin electrical feedthroughs used in harsh environments.

BACKGROUND

Hermetically sealed electronic packages (such as flat-pack, plug-ins, microwave, power package etc.) provide a hermetic containment serving as a key line of defense protecting the integrated electronic devices and components either from external mechanical damage, moisture and RF/MW signal emission or from high/cryogenic-temperature, high-pressure, high-vacuum, and high corrosive harsh environment for providing electric power, and signal and data transmission to or from external instrument or control system. At high-temperature environment an electronic package may suffer either from inadequate thermal dissipation or from maximum operating temperature up-limit of the integrated electronic devices. At moisture-rich or high corrosive environment such as in steam turbine or nuclear reactor vessel, an electronic package and the enclosed integrated electronic devices may by degraded by conductive fluid induced electrical conductivity increase, while the enclosed optoelectronic devices may lose functionality by fouling or condensation. A desirable electronic package should isolate the environmental communication with internal electronic devices but maintain adequate thermal communication for dissipating heat from inside electronic elements to external environment. To provide such a hermetically sealed electronic package, several sealing technologies, such as laser welding, metal soldering, metal brazing, glass-to-metal seal, and ceramic-to-metal seal, can be used to couple or fuse package lid(s) and electrical feedthroughs. It is obvious that the hermeticity of an electronic package is also absolutely dependent upon that of the integrated electrical feedthroughs, which could be failed by the formation of the sealing material cracks, induced by high thermo-mechanical stress or thermal stress for simplicity.

An electronic package is commonly made by machining a metal material based enclosure, usually a material with low coefficient of thermal expansion (low-CTE) material, such as having a CTE≤9 ppm/° C., or with a high thermal conductive material, such having thermal conductive properties of >100 W/m·K, into a complex shape. However, low-CTE materials, such as Kovar and Ti-alloy, also have relatively low thermal conductivity (<30 W/m·K) properties, while high thermal conductive materials, such as Cu-alloy and Al-alloy, have high coefficient of thermal expansion (high-CTE) material, such as having a CTE>16 ppm/° C. As a fact that the integrated electronic chips and substrates are made from low-CTE materials, such as Si, AlN, GaAs, Borosilicate glass, and $Al_2O_3$ etc., and the close CTE match requirement among the integrated electronic devices, substrates, and heat dissipation materials could prevent mechanical stress and thermal stress induced package failure modes.

Despite of tremendous efforts and advancements in the electronic packaging technology that is rapidly advancing at the chip, the board, and the systems level, contributing to the reduction of system's physical dimensions, it still has great challenge when the electronic package has integrated with either a plurality of high-power modules and high-speed electronic modules or optoelectronic devices, or a plurality of electrically powered multi-pin electrical feedthroughs. In fact that each electronic or optoelectronic device may be equivalent to "a heat source" for generating heat that could induce electronic device performance deterioration or premature failure when the device operates above its maximum allowed up-limit operating temperature. Although the use of the high-conductive heatsink could mitigate electronic failures by dissipating heat from package to environment, the electronic package, especially consisting of a plurality of high-power or high-speed electronic devices and electrically powered multi-pin feedthroughs, still can be hermetically failed by nonuniform thermal stress around pin-seal area, which is not only related to the electronic package optimum thermal material management for effectively dissipating heat but also to the electronic package optimum thermal stress management for mitigating thermal stress amplitude around seal area in each integrated electrical feedthrough.

An electrical feedthrough can be operated in either passive mode for low-power signal transmission or operated in active mode for high-power electronics signal processing or/and electrical power delivery flowing through conductive pins. In the active operating mode with a plurality of high-current electrically powered pins, the pin and seal subassembly in an electrical feedthrough may be also regarded as an "extra heat source" that generates heat by its thermal resistance. Since an electrical feedthrough is often a mechanic assembly with CTE-mismatched metal header, glass-ceramic sealant, and metal pins, the extra heat induced pin-seal area temperature rise could lead to highly nonuniform thermal stress around seals. Especially, a hermetic failure may occur when this nonuniform thermal stress gradient exceeds the maximum shear bonding strength of the sealing material with metal header and/or with metal pins. It is desirable that an electric package not only provides adequate thermal management for ensuring effective heat dissipation but also provides sufficient thermal stress management for ensuring high shear bonding strength during its full service lifetime.

Therefore, a need exists for providing hermetically sealed electronic package with electrically powered multi-pin electrical feedthroughs, which are able to dissipate heat and to mitigate thermal stress for providing electric power, signal and data transmission from the harsh environment to or from external instruments or control systems.

BRIEF SUMMARY OF THE INVENTION

A hermetically sealed electronic package for electronic devices is provided for protecting sensitive electronics in the harsh environments. The package may be used for electric power, signal and data transmission from a harsh environment to or from external instrument or control system. The harsh environment could be non-thermal conduction aerospace, damping steam turbine engines, nuclear reactor vessels, downhole, and geothermal wells that may expose extreme temperature, moisture and pressure etc. The package may include a plurality of integrated electronic and optoelectronic devices or modules, thermal conduction panels, electrically powered multi-pin electrical feedthroughs, and preferably high-emissive material coated or oxidized package surfaces. For effective thermal material management in mitigating electronics failure modes, diamond particles or grains, SiC particles or grains, graphite, and/or carbon fibers dispersed copper and aluminum matrix materials, with potential thermal conductivities varying from 100 W/m·K to 1200 W/m·K, may be used to make thermal conduction panels for enhancing heat dissipation, especially for high-power electronic module or high-speed/high-power electronic module with electrically powered multi-pin electrical feedthroughs.

In some embodiments, the package may include a thermal panel having a panel interior surface and a panel exterior surface with one or more electronic devices in thermal communication with the panel interior surface. An enclosure, isolating environmental communication from internal electronic devices and modules, may be coupled to the thermal panel, and the enclosure may have an enclosure interior surface and an enclosure exterior surface. A cavity may be formed by the enclosure interior surface, and the panel exterior surface may be coupled to the enclosure interior surface. The header of an electrical feedthrough may be coupled to the enclosure by a coupling or fusion method (such as laser welding, metal soldering/brazing process), and an electrical feedthrough may have a plurality of electrically conducting pins penetrating from the enclosure interior surface to the enclosure exterior surface, hermetically sealed with an electrical insulation material via a high-temperature firing process or metal soldering or brazing process prior to the electronic devices integration.

In further embodiments, an electronic package may include a thermal panel having a panel interior surface and a panel exterior surface with one or more electronic devices in thermal communication with the thermal panel. An enclosure may be coupled to the thermal panel, and the enclosure may have an enclosure interior surface and an enclosure exterior surface. The enclosure interior surface may be coupled to the panel interior surface and the enclosure exterior surface may be coupled to the panel exterior surface. A cavity may be formed by the panel interior surface and the enclosure interior surface. An electrical feedthrough may be coupled to the enclosure, and the electrical feedthrough having one or more electrical feedthrough subassemblies. One or more electrical feedthrough subassemblies, may have at least one conducting pin penetrating from the enclosure interior surface to the enclosure exterior surface, preferably with each conducting pin sealed to a header via a hydrophobic crystalline sealing material such that the pin can be mechanically bonded to the header with an electrical insulation material via a high-temperature firing process prior to the electronic devices integration.

In still further embodiments, a package may include an emissive coating layer covering all or portions of the enclosure exterior surface and/or all or portions of the panel exterior surface to enhance thermal radiation especially for being used in vacuum aerospace environment, where thermal conduction paths are highly limited.

In still further embodiments, a package may include one or more getters and/or absorbers which may be disposed in the cavity to protect internal electronic devices from hazardous gases and moisture ingress induced performance degradation, potentially released from package interior materials, to protect optoelectronic devices from organic solvents or gaseous fouling or condensation induced either mechanical or/and electrical failures.

BRIEF DESCRIPTION OF THE DRAWINGS

Some embodiments of the present invention are illustrated as an example and are not limited by the figures of the accompanying drawings, in which like references may indicate similar elements and in which:

FIG. 5 illustrates a perspective view of an example of an electronic package having integrated electronic devices according to various embodiments described herein.

FIG. 13 shows a table that has listed some material properties that are used for thermal stress analyses according to various embodiments described herein.

DETAILED DESCRIPTION OF THE INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Figure 1:
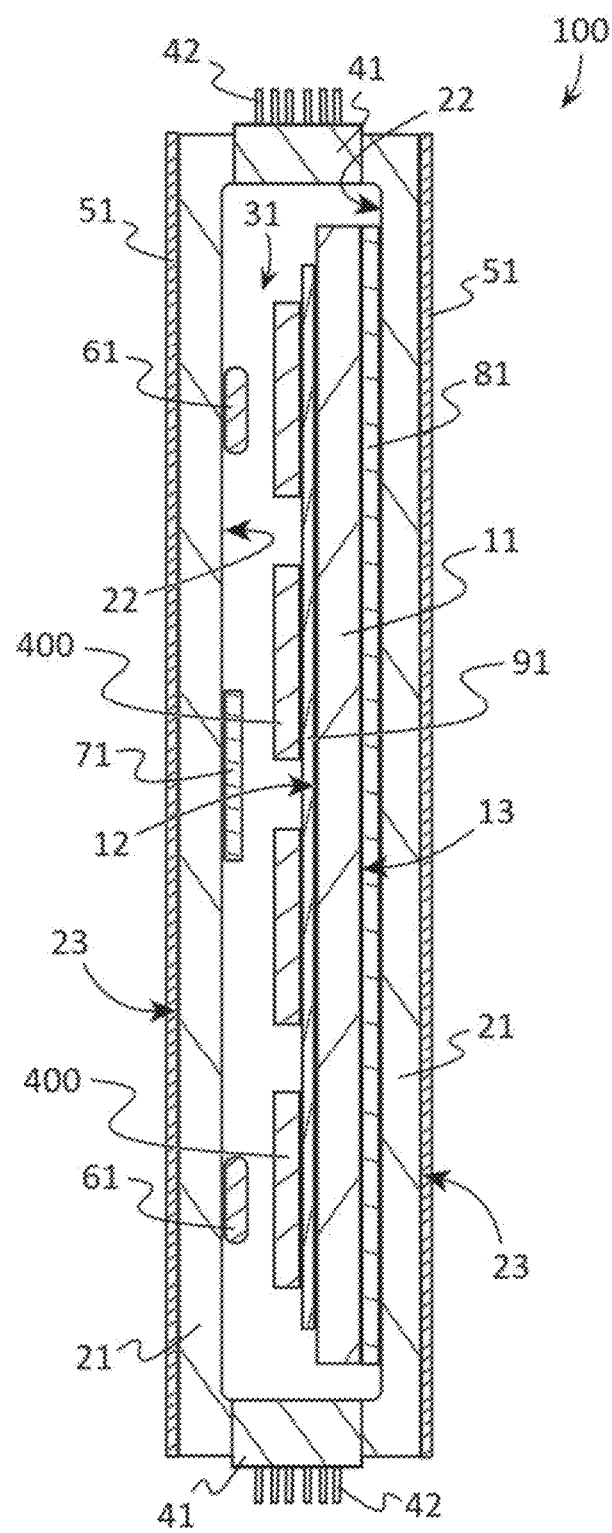
FIG. 1 depicts a sectional view of an example of a hermetically sealed electronic package according to various embodiments described herein.

For purposes of description herein, the terms "upper", "lower", "left", "right", "rear", "front", "side", "vertical", "horizontal", and derivatives thereof shall relate to the invention as oriented in FIG. 1. However, one will understand that the invention may assume various alternative orientations and step sequences, except where expressly specified to the contrary. Therefore, the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Although the terms "first", "second", etc. are used herein to describe various elements, these elements should not be limited by these terms. These terms are only used to distinguish one element from another element. For example, the first element may be designated as the second element, and the second element may be likewise designated as the first element without departing from the scope of the invention.

As used in this application, the term "about" or "approximately" refers to a range of values within plus or minus 10% of the specified number. Additionally, as used in this application, the term "substantially" means that the actual value is within about 10% of the actual desired value, particularly within about 5% of the actual desired value and especially within about 1% of the actual desired value of any variable, element or limit set forth herein.

A new hermetically sealed electronic package for electronic devices is discussed herein. In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention and is not intended to limit the invention to the specific embodiments illustrated by the figures or description below.

The present invention will now be described by example and through referencing the appended figures representing preferred and alternative embodiments. FIGS. 1-5 illustrate examples of a hermetically sealed electronic package ("the package") 100 according to various embodiments. In some embodiments, the package 100 may comprise a thermal panel 11 having a panel interior surface 12 and a panel exterior surface 13. One or more integrated electronic device and optoelectronic devices, ("electronic devices") 400 may be coupled to the panel interior surface 12 in thermal communication with the thermal panel 11. An enclosure 21 may be coupled to the thermal panel 11, and the enclosure 21 may have an enclosure interior surface 22 and an enclosure exterior surface 23. A cavity 31 may be formed by the enclosure interior surface 22 and optionally by the panel interior surface 12. One or more electrical feedthroughs 41 may be coupled to the enclosure 21, and each electrical feedthrough 41 may comprise one or more conducting pins 42 which may extend between the enclosure interior surface 22 and enclosure exterior surface 23. An emissive coating layer 51 may cover all or portions of the enclosure exterior surface 23 and optionally all or portions of the panel exterior surface 13. Preferably, one or more getters 61 and/or absorbers 71 may be disposed in the cavity 31.

The cavity 31 of the package 100 may be shaped and configured to receive one or more electronic packages 300 each having one or more electronic devices 400. As an example, one of the electronic devices 400 may comprise an integrated electronic device 400A, which may be encapsulated by polymer-based material and mounted onto a printed circuit board (PCB) via thermal interface material. Integrated electronic devices 400A may include integrated circuit chips, diodes, transistors, resistors, capacitors, etc. As another example, an electronic device 400 may comprise an optoelectronic device 400B which often integrates a charge-coupled device (CCD), Complementary metal-oxide-semiconductor (CMOS), light emitting diodes (LED), and sensors that may also be sealed in cavity 31 and that can be directly attached to a PCB and connected to other components.

One or more electronic devices 400 may be coupled to the panel interior surface 12 in thermal communication with the thermal panel 11 via one or more thermal interface materials 81. Thermal interface material(s) 81 may include various thermal interface materials (for example, 3M fabricated thermal grease, adhesive, tapes, pads, etc.), thermal spreaders and heatsinks (for example, heat sink grease (HSG), copper-molybdenum (CuMo), copper-tungsten (CuW) alloys, etc.), and thermal conduction materials (for example, carbon fiber woven blanket, fiber reinforced metal composites etc.) for dissipating heat from high-power chips or modules to the package surfaces. Signal control or data transmission to and from the electronic devices 400 may be via direct wire connectors, via directly wire bonding among various devices, or any other suitable method for providing electronic communications.

An enclosure 21 may form or bound all or portions of the cavity 31. Preferably, the enclosure 21 may be made from or may comprise a metal material. In some embodiments, the enclosure 31 may be made from or may comprise a metal material having a low coefficient of thermal expansion (CTE) and low thermal conduction (low-k) properties, such as Kovar (nickel-cobalt ferrous alloy), Invar (nickel-iron alloy), and titanium alloys, which are typically used for making low-power signal process and data transmission modules. In further embodiments, the enclosure 31 may be made from or may comprise a metal material having high thermal conduction (high-k) properties, such as copper alloys, copper-zinc alloys, and aluminum alloys, and any other high-thermal conductive material(s) which are typically used for making high-power or high-speed signal process modules. Despite of high-CTE and low-k properties from stainless steel material, it is often also used for making low-cost package for low-power signal process and data transmission modules, where the package hermeticity is not a primary concern but effective heat dissipation is.

In some embodiments, the metal enclosure 31 may be made from or may comprise a metal alloy having a coefficient of thermal expansion less than 15 ppm/° C. and relative low thermal conductivity less than 100 W/m·K, such as nickel-cobalt ferrous alloy; titanium alloy; and nickel-iron alloy for making low-heat dissipation based hermetically sealed electronic packages. In further embodiments, the metal enclosure 31 may be made from or may comprise a metal alloy having a coefficient of thermal expansion greater than 15 ppm/° C. and relative high thermal conductivity greater than 100 W/m·K, such as copper alloy; copper-zinc alloy; and aluminum alloy for making medium-heat dissipation based hermetically sealed electronic packages. In another embodiments, the metal enclosure 31 may be made from or may comprise a metal alloy having a coefficient of thermal expansion greater than 15 ppm/° C. and thermal conductivity less than 100 W/m·K, such as stainless steels, 17-4PH, and nitronic stainless steels for making generic low-heat dissipation based electronic packages.

In some embodiments, one or more exterior surfaces 13, 23, of the package 100 may comprise an emissive coating layer 51. Preferably, a package 100 may comprise an emissive coating layer 51 should the package 100 be used or disposed in the vacuum or aerospace environment with little to no air and/or flowing air or atmosphere. The heat generated by electricity flowing through the components of the package 100 may be transported to one or more thermal panels 11 and/or package exterior surfaces then to ambient by thermal radiation. To optimize radiation efficiency an emissive coating layer 51 may comprise any material or surface treatment preferably having an emissivity greater than 0.4, and more preferably greater than 0.75, although other emissivities may be used. In some embodiments, an emissive coating layer 51 may comprise a black coating, such as K2V, Ultr VE-17, and BK-11 from Tiodize, Ultra black, fractal black, vacuum black and PVD films from Acktar. In further embodiments, an emissive coating layer 51 may comprise an anodized oxide layer of the material(s) forming a panel exterior surface 13 and/or an enclosure exterior surface 23. For example, an enclosure exterior surface 23 made of Al-alloy or Ti-alloy may comprise an emissive coating layer 51 comprising a thin layer of oxide on the Al-alloy or Ti-alloy enclosure exterior surface 23 by anodizing or electrochemical process that is developed by Tiodize Co. Inc. As another example, an enclosure exterior surface 23 made of nickel may comprise an emissive coating layer 51 comprising a thin layer of oxidized nickel. In still further embodiments, an emissive coating layer 51 may comprise a nanoparticle material, such as nanoparticle-based Gold coating or oxidized Nickle coating also can provide an emissivity of 0.50 to 0.75 for radiation based heat dissipation.

In some embodiments, the package 100 may comprise one or more getters 61 which may be disposed in the cavity 31. Optionally, a getter 61 may be coupled to an enclosure interior surface 22 or a panel interior surface 12 within the cavity 31. A getter 61 may comprise a material, device, or method, such as HSG, HGR1, HGR2 and HTIR2, such as made by the HSG GROUP, LLC of Tinton Falls, N.J., that may be configured to remove, sequester, or absorb one or more substances, such as organic vapor, hydrogen gas, oxygen gas, nitrogen gas, and moisture, to protect the electronic devices 400 in the cavity 31 from performance degradation, including optoelectronic devices 400B, such as lasers, sensors, or optical components that are sensitive to these substances or any other contaminants. Preferably, one or more getters 61 may be coupled to an interior surface 22, 12, before the package 100 undergoes a hermetic seal process.

In some embodiments, the package 100 may comprise one or more absorbers 71 which may be disposed in the cavity 31. Optionally, an absorber 71 may be coupled to an enclosure interior surface 22 or a panel interior surface 12 within the cavity 31. An absorber 71 may comprise a material, device, or method that may be suitable for absorbing electromagnetic radiation, such as radio frequency (RF) and microwave (MW) radiation, to protect the electronic devices 400 in the cavity 31, including optoelectronic devices 400B, such as lasers, sensors, or optical components that are sensitive to electromagnetic interference. In preferred embodiments, an absorber 71 may comprise a RF/MW absorber having a narrow-band of 0.1-6 GHz absorbing performance. In further preferred embodiments, an absorber 71 may comprise a RF/MW absorber having wideband of 1-100 GHz absorbing performance. For example, a package 100 may comprise one or more absorbers 71 that may be configured as a RF/MW absorber (see Laird, Eccosorb, FlexK, Eccostock, etc.) with narrow-band of 0.1 to 6.0 GHz and/or wideband of 1.0 to 100 GHz polymer-based absorbers.

Inside the cavity 31, one or more, such as all, of the pre-packed electronic devices 400 and their associated components may be mounted onto an electronic substrate 91, such as a printed circuit board (PCB), ceramic substrate, or the like, and then the electronic substrate 91 may be coupled to a thermal conduction panel 11. In some embodiments, a thermal panel 11 may be made from or may comprise a material having a thermal conductivity of between approximately 100 W/m·K to 1200 W/m·K. In further embodiments, a thermal panel 11 may be made from or may comprise a material having a coefficient of thermal expansion less than (8±2) ppm/° C., while in other embodiments, a thermal panel 11 may be made from or may comprise a material having a coefficient of thermal expansion greater than 10 ppm/° C.

FIGS. 7A-7E illustrate exemplary embodiments of thermal panel 11 structures and materials that can assist adequate thermal management of the package 100. Preferably, a thermal panel 11 provides both thermal spreader and heat sink functions for dissipating heat away from integrated electronic devices, in general, from high-power or high-speed electronic devices 400, in particular, to one or more exterior surfaces 13, 23.

Figure 7A:
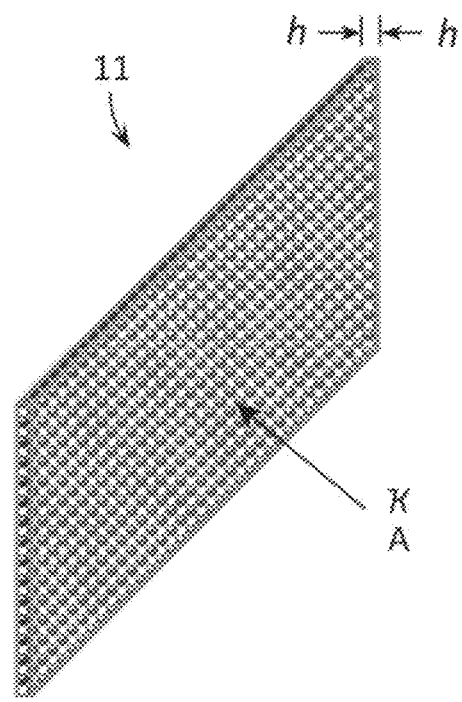
FIG. 7A illustrates a perspective view of an example of a thermal panel according to various embodiments described herein.

FIG. 7A depicts an example of a thermal panel 11 that may be made from or may comprise metal matrix composites such as diamond-copper or diamond-aluminum or diamond-silver composites with approximately 6.0 to 10.0 ppm/° C. thermal expansion and approximately 300 to 800 W/m·K thermal conductivity properties. For example, a thermal panel 11 may be made from or may comprise metal matrix composites such as diamond particles dispersed in copper matrix material. As another example, a thermal panel 11 may be made from or may comprise metal matrix composites such as diamond particles dispersed in aluminum matrix material. As a further example, a thermal panel 11 may be made from or may comprise metal matrix composites such as diamond particles dispersed in silver matrix material. In further embodiments, a thermal panel 11 may be made from or may comprise metal matrix composites such as diamond-copper or diamond-aluminum or diamond-silver composites having diamond particles that have a size range of between approximately 300 nanometers to 3.0 micrometers or more preferably between 50 micrometers to 200 micrometers. In further embodiments, a thermal panel 11 may be made from or may comprise metal matrix composites such as diamond-copper or diamond-aluminum, diamond-silver composites having approximately 55 to 65 percent in diamond-Cu and diamond-Al and approximately 60-70 percent diamond particles in diamond-silver to maintain optimum thermal conduction paths by particle grain boundaries.

Figure 7B:
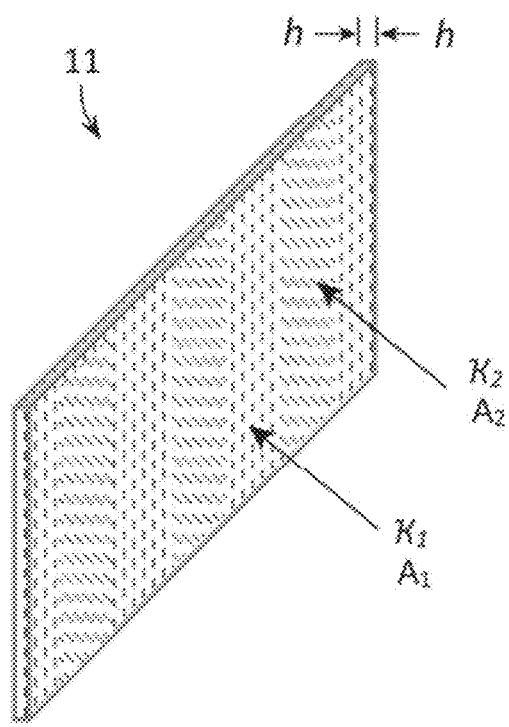
FIG. 7B shows a perspective view of another example of a thermal panel according to various embodiments described herein.

FIG. 7B illustrates an example of a thermal panel 11 that may be made from metal matrix composites, such as carbon fiber reinforced copper or aluminum composites with approximately 800 to 1200 W/m·K thermal conductivity properties. For example, a thermal panel 11 may be made from or may comprise metal matrix composites, such as carbon fibers dispersed in copper matrix material with approximately 800 to 1200 W/m·K thermal conductivity properties. As another example, a thermal panel 11 may be made from or may comprise metal matrix composites such as carbon nanofibers dispersed in copper matrix material with approximately 800 to 1200 W/m·K thermal conductivity properties. As a further example, a thermal panel 11 may be made from or may comprise metal matrix composites, such as carbon fibers dispersed in aluminum matrix material or copper matrix material with approximately 800 to 1200 W/m·K thermal conductivity properties. As still another example, a thermal panel 11 may be made from or may comprise metal matrix composites such as carbon nanofibers dispersed in aluminum matrix material or copper matrix material with approximately 800 to 1200 W/m·K thermal conductivity properties.

Figure 7C:
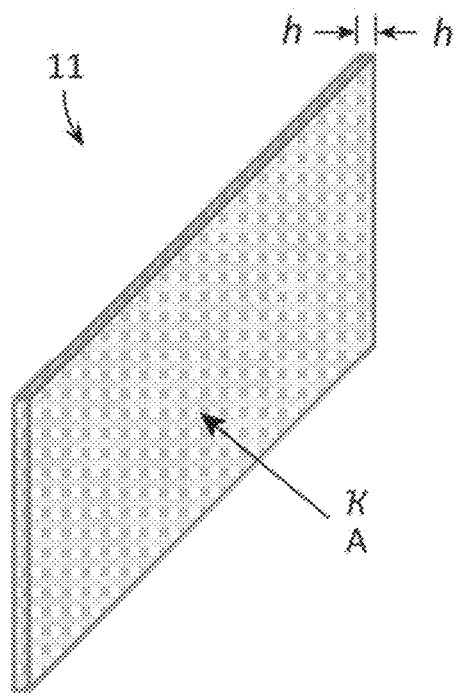
FIG. 7C depicts a perspective view of still another example of a thermal panel according to various embodiments described herein.

FIG. 7C shows an example of a thermal panel 11 that may be made from metal matrix composites such as graphite fiber reinforced copper and aluminum composites with approximately 8.0 to 12.0 ppm/° C. thermal expansion and approximately 600 to 800 W/m·K thermal conductivity properties. For example, a thermal panel 11 may be made from or may comprise metal matrix composites such as graphite fibers dispersed in copper matrix material with approximately 8.0 to 12.0 ppm/° C. thermal expansion and approximately 600 to 800 W/m·K thermal conductivity properties. As another example, a thermal panel 11 may be made from or may comprise metal matrix composites such as graphite fibers dispersed in aluminum alloy with approximately 8.0 to 12.0 ppm/° C. thermal expansion and approximately 600 to 800 W/m·K thermal conductivity properties.

Figure 7D:
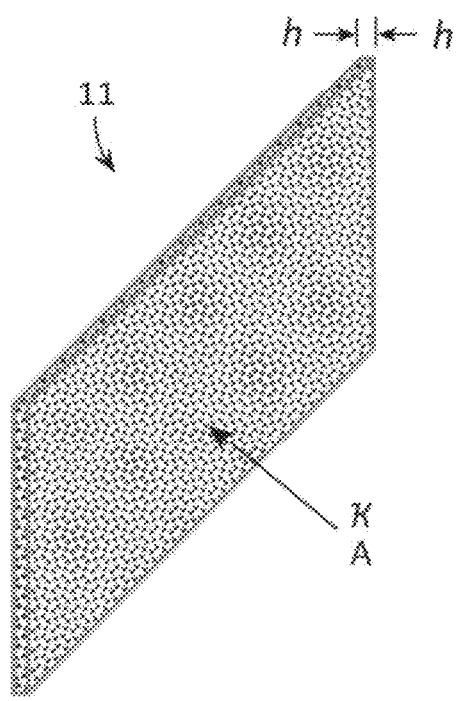
FIG. 7D illustrates a perspective view of yet another example of a thermal panel according to various embodiments described herein.

FIG. 7D depicts an example of a thermal panel 11 that may be suitable for medium-power electronic device 400 modules and may be made from metal matrix composites such as Silicon carbide (SiC) particle embedded copper and aluminum composites with approximately 6.0 to 10.0 ppm/° C. thermal expansion and approximately 100 to 300 W/m·K thermal conductivity properties. In this and some embodiments, a thermal panel 11 may be made from or may comprise metal matrix composites such as silicon carbide particles dispersed in copper matrix material or silicon carbide particles dispersed in aluminum matrix material having a thermal conductivity of between 100 W/m·K to 300 W/m·K. In further embodiments, a thermal panel 11 may be made from or may comprise metal matrix composites having a thermal conductivity of between 100 W/m·K to 300 W/m·K and having nano-scaled silicon carbide particles, and more preferably comprises approximately 60 to 70 percent silicon carbide particles to maintain optimum thermal conduction paths by particle grain boundaries. For example, copper matrix material having approximately 60 to 70 percent embedded nano-scaled silicon carbide particles may provide a thermal conductivity from at least 150 W/m·K to 300 W/m·K thermal conductivity. As another example, aluminum matrix material having approximately 60 to 70 percent embedded nano-scaled silicon carbide particles may provide a thermal conductivity from at least 100 W/m·K to 200 W/m·K thermal conductivity.

Figure 7E:
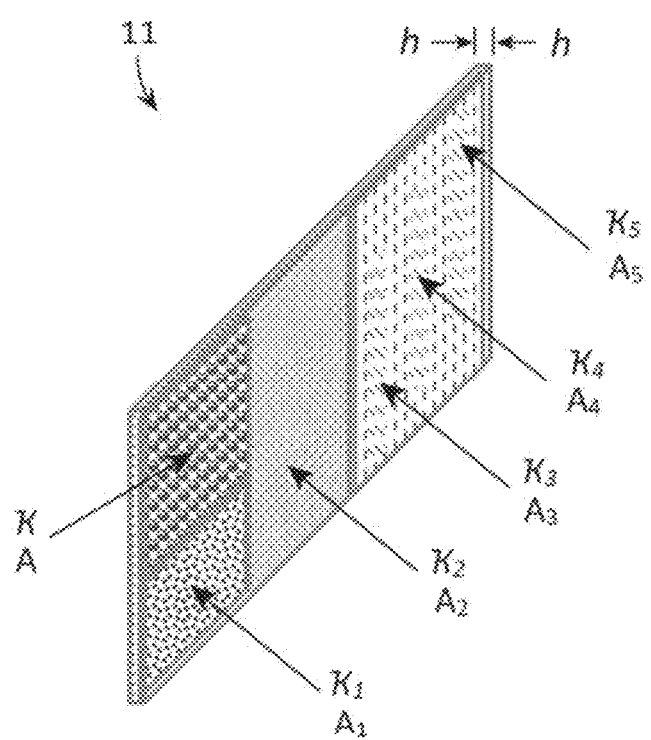
FIG. 7E shows a perspective view of still yet another example of a thermal panel according to various embodiments described herein.

FIG. 7E illustrates an example of a thermal panel 11 comprising two or more of the above-mentioned materials that may be arranged match to match the positioning of electronic devices 400 having different heat dissipation needs and allowing possible asymmetrical distribution of the high-power electronic devices 400 on the thermal panel 11.

The package 100 may comprise one or more electrical feedthroughs 41 which may be coupled to the enclosure 21. Generally, an electrical feedthrough 41 may one or more conducting pins 42 which may extend between the enclosure interior surface 22 and enclosure exterior surface 23. An electrical feedthrough 41 may optionally be configured as any suitable electrical connector, such as inline type connectors, Micro-D or Nano-D type multi-pin connectors, RF/MW connectors 46, and Fiber-optic connectors, that may be used for the electric, optic, and electromagnetic signal transmissions or interconnections between the electronic devices 400 of the package 100 and external instrument(s).

FIGS. 1-6A depict examples of electrical feedthroughs 41. An electrical feedthrough 41 may comprise an assembly of a header 44 and a number of conducting pins 42 bonded by electrically insulated ceramic or sealing material bead 43, and each conducting pin 42 may be bonded to header 44 also via this sealing material bead 43. Since the metal pin 42 is cylinder shaped like wire, the sealing material bead 43 has to be made in hollow cylinder shape with its inner diameter close to pin 42 diameter, and outer diameter close to metal header 44 cavity diameter, while bead 43 length is equal to sealing length for bonding pin 42 to metal header 44. The sealing material bead 43 will melt under high-temperature firing process so that this dielectric sealing material will bond pin 42 with header 44 after cool down to ambient to form a pin and header seal 47. Thus, the sealing material bead 43 represent the sealing bead that has not experienced manufacture process, while pin and header seal 47 represents the post high-temperature firing process seal between the header 44, the sealing material bead 43, and pin 42. An electrical feedthrough 41 (electrical feedthrough assembly 41) may comprise one or more fasteners 45, such as threaded apertures, bushing, and threaded studs, which may be used to couple electrical connectors to the electrical feedthrough 41. In some embodiments, a header 44 may be coupled, such as by being fused, to the enclosure 21 via vacuum laser welding, metal brazing, soldering processes, or any other suitable method. In other embodiments, a portion of the enclosure 21 may form the header 44 so that the sealing material bead 43 may be bonded directly to the enclosure 21 either via high-temperature firing process or via metal soldering/brazing process. In some embodiments, a header 44 may be made from or may comprise nickel-cobalt ferrous alloy; titanium alloy; and nickel-iron alloy; and/or any other low-thermal conductive material(s). In other embodiments, a header 44 may be made from or may comprise copper alloy; copper-zinc alloy; aluminum alloy; and/or any other high-thermal conductive material(s).

Figure 6A:
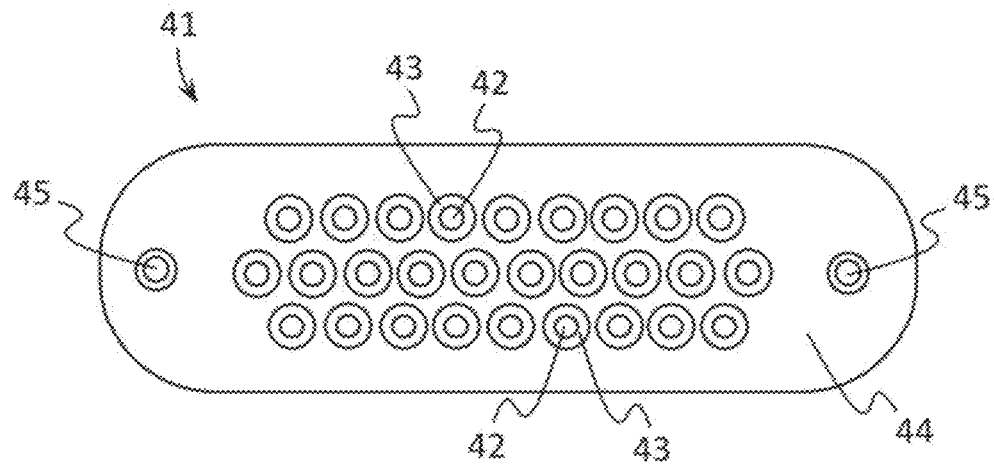
FIG. 6A shows an elevation view of an example of an electrical feedthrough according to various embodiments described herein.
Figure 6B:
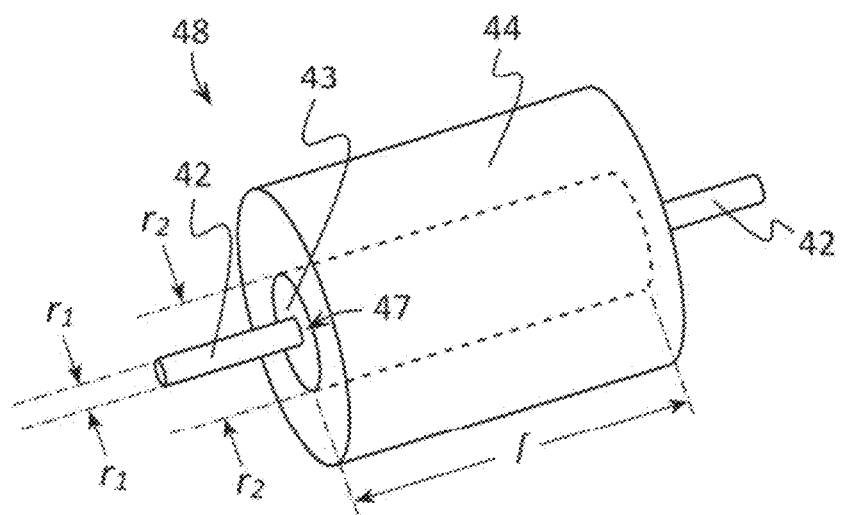
FIG. 6B depicts a perspective example of an electrical feedthrough subassembly of an electrical feedthrough according to various embodiments described herein.

In the example of FIG. 6A, the electrical feedthrough 41 is shown as having twenty eight conducting pins 42 in twenty eight electrical feedthrough subassemblies 48. As shown in FIG. 6B, an electrical feedthrough subassembly 48 comprises a conducting pin 42, pin and header seal 47, and portion of the header 44 that the conducting pin 42 is hermetically sealed to via the pin and header seal 47. Typically, the pin 42 number could range from 1 to 128 or more. A conducting pin 42 may be made from or comprise any electrical conducting material, titanium alloys, copper alloys [such as, Beryllium copper (BeCu) chromium copper (CrCu), and brass], Inconel X750 alloys, Alloy 52, Kovar alloy, and other nickel-cobalt ferrous alloys. In other embodiments, a conducting pin 42 may be plated with an electrically conductive material, such as 1.2-5.0 micrometer thick Nickel and Gold bilayers for providing better electrically contact against potential ion outer diffusion from the pin material into the sealing material.

Portions of the conducting pins 42 have been insulated from the header 44 and/or enclosure 21 by a sealing material bead 43 which may comprise a dielectric sealing material with more than 5,000 Mohm insulation resistances, 5-20 KV/mm dielectric strength, and 3-10 dielectric constants. Preferably, each conducting pin 42 may be insulated from the header 44 and/or enclosure 21 by a sealing material bead 43 electrically isolating pin 42 from header seal 47, and the sealing material bead 43 may also seal the conducting pin 42 to the header 44 and/or enclosure 21 as a pin and header seal 47 so that water and other contaminates are prevented from entering the package cavity 31. For the purposes of this disclosure, some dimensions of a sealing material bead 43 and one of its conducting pins 42 (and therefore its respective pin and header seal 47) may be described with $r_1$ as conducting pin 42 radius, $r_2$ as sealing material bead 43 outer radius, and l as sealing material bead 43 length. In preferred embodiments, the package 100 may comprise one or more sealing material beads 43 having hydrophobic properties and having a length greater than 1.5 millimeters and more preferably greater than 4.0 millimeters.

In some embodiments, an electrical feedthrough 41 may comprise a header 44 which may be coupled to the enclosure 21, and the header 44 may be coupled to the enclosure 21 to couple the electrical feedthrough 41 to the enclosure 21. Preferably, the header 44 may be made from a metal material, such as Kovar, titanium-alloy, stainless steel, aluminum-alloy, etc. To avoid mechanical stress between the enclosure 21 and a header 44, it is preferred that the enclosure 21 and header 44 made be made from the same material or from two materials having matched CTE. However, in a CTE mismatch case between the enclosure 21 and header 44, such as an aluminum-alloy enclosure 21 and a stainless-steel header 44 or a titanium-alloy enclosure 21 and an aluminum-alloy header 44, the heat transfer from conducting pin 42 to the sealing material bead 43 and header 44 will suffer from thermal resistance. When an electronic package, such as the package 100, includes a plurality of such electrically powered multi-pin electrical feedthroughs 41, each electrical feedthrough 41 effectively becomes a "heat source" that adds extra heat to the package for dissipation. This "extra heat" may not add extra burden for heat dissipation if the electrical feedthrough 41 has only limited number of pins 42 carrying small amount of current, such as less than 0.5 A, otherwise a heatsink may be helpful in assisting extra heat dissipation. However, this "extra heat" may cause hermetic failure of the electrical feedthrough 41 because of "temperature rise" when a large number of the pins 42 are electrically powered with high currents, especially, when the electronic package is deployed under downhole environment. In some embodiments, the package 100 may be a hermetically sealed electronic package comprising of a plurality of electrically powered conducting pins 42, in one or more electrical feedthroughs 41, and each electrical feedthrough generates extra heat and leads to temperature rise of the electronic package 100.

Figure 8A:
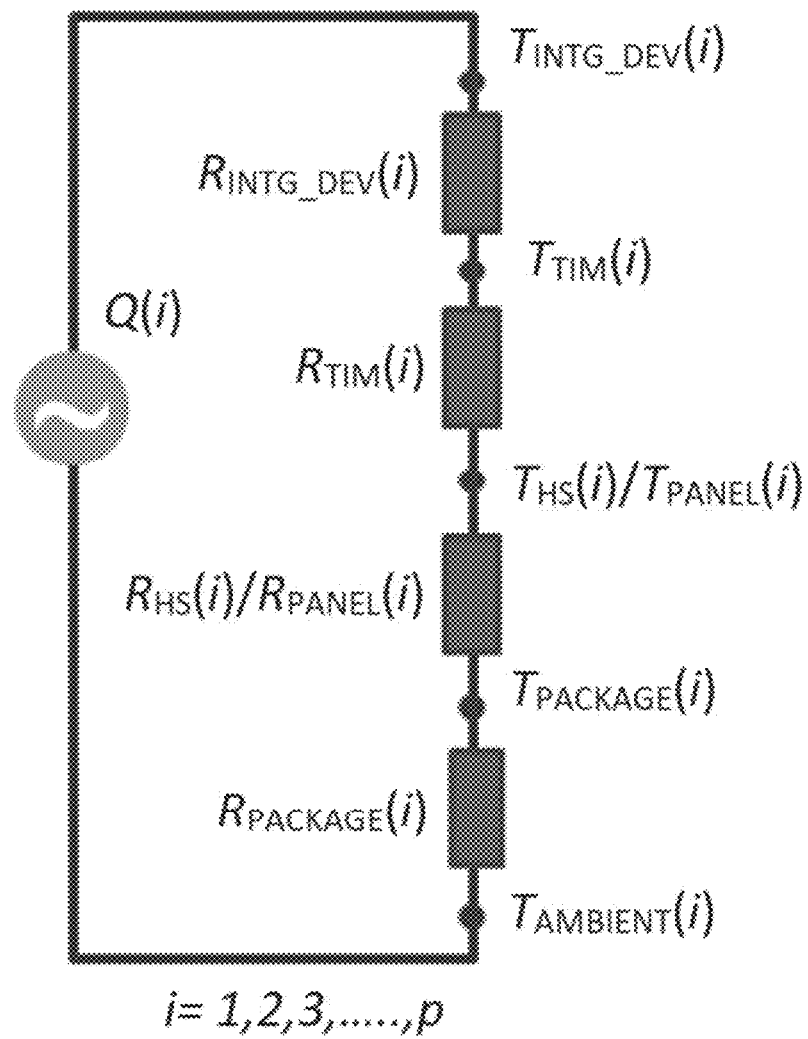
FIG. 8A depicts a diagram of a single integrated device thermal circuit according to various embodiments described herein.
Figure 8B:
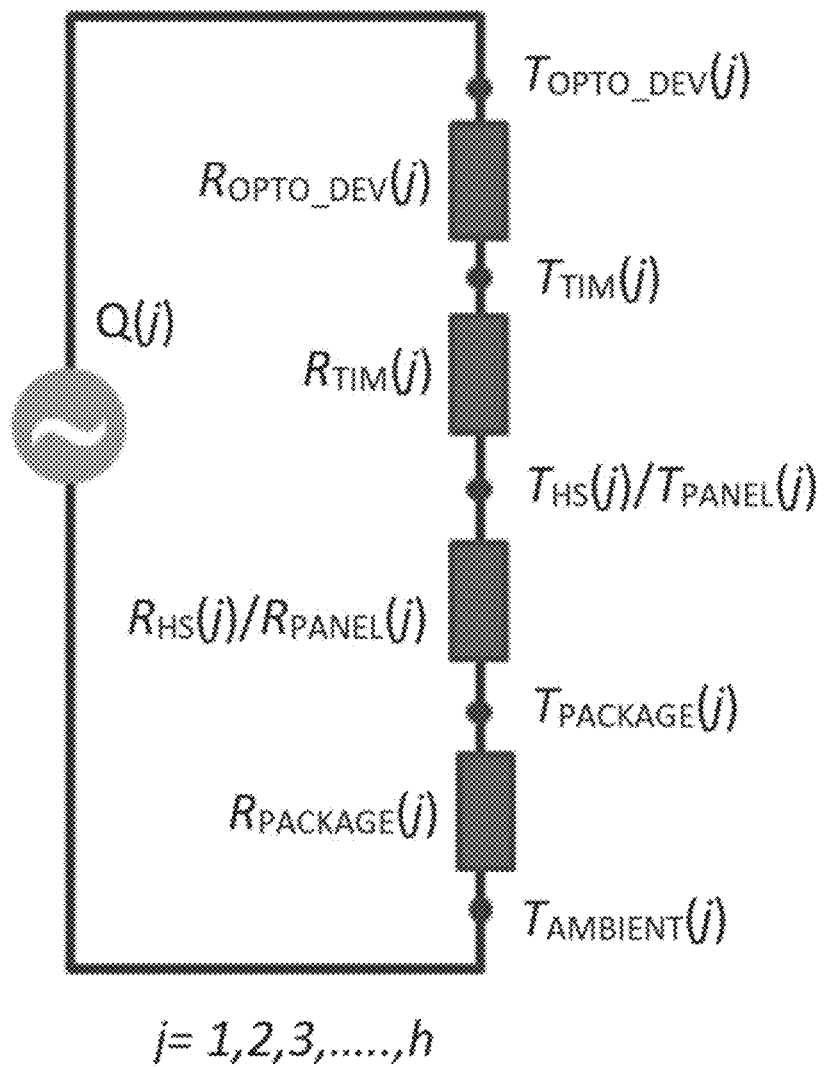
FIG. 8B illustrates a diagram of a single optoelectronic device thermal circuit according to various embodiments described herein.
Figure 8C:
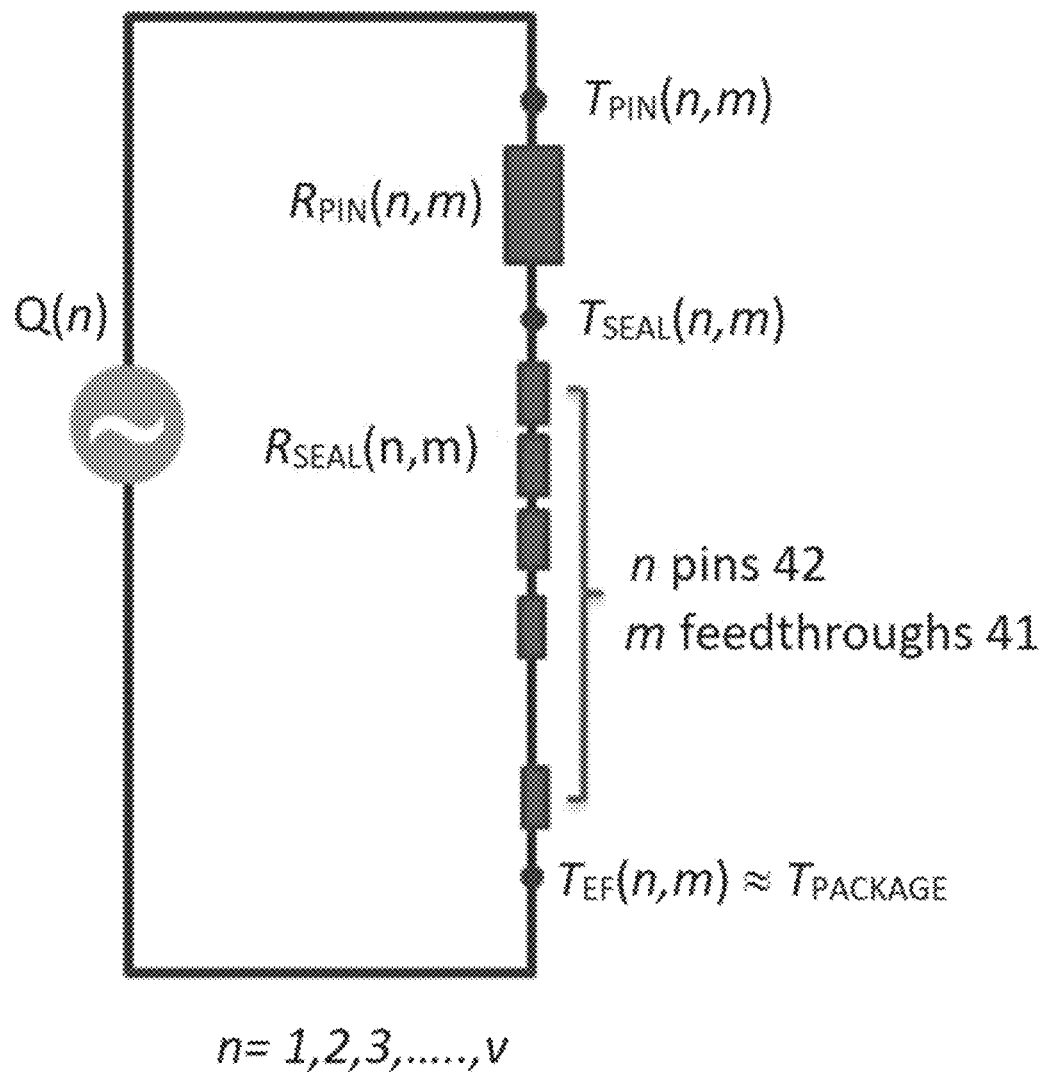
FIG. 8C shows a diagram of an electrical feedthrough single-pin thermal circuit according to various embodiments described herein.

To provide adequate thermal stress management for making a highly reliable hermetically sealed electronic package, one has to find how the hermeticity could be lost by thermal stress. To quantitatively predict potential thermal stress induced hermetic failure around seals, this disclosure has modeled an electronic package as equivalent to a thermal analog circuit, where each electronic device 400 and electrical feedthrough 41 of the package 100 is represented by an equivalent thermal resistor and circuit. In this manner, a hermetically sealed electronic package 100 comprising of a plurality of multi conducting pin electrical feedthroughs 41 may be regarded equivalently as a series of electrically powered thermal resistors, responsible for heat induced package 100 temperature rise. In preferred embodiments, in a package 100 having two or more multi-pin electrical feedthroughs 41, each multi-pin electrical feedthroughs 41 can be regarded equivalently as a series of extra heat sources, responsible for feedthrough 41 nonuniform thermal stress induced hermetic failures. FIGS. 8A-8C illustrate exemplary embodiments of a method of determining the heat generated by the electronic devices 400 and electrical feedthroughs 41 of a package 100 where a thermal circuit diagram only represents a type of integrated electronic device 400A or optoelectronic device 400B, or/and single-pin electric feedthrough 41. FIG. 8A simplifies an equivalent thermal circuit that includes all possible thermal resistances, where $R_{INTG\_DEV}(i)$, $R_{TIM}(i)$, $R_{HS}(i)$, and $R_{PACKAGE}(i)$ are i-th integrated electronic device, while $T_{INTG\_DEV}(i)$, $T_{TIM}(i)$, $T_{HS}(i)$, and $T_{PACKAGE}(i)$ are corresponding operating temperature of i-th integrated electronic device. FIG. 8B also simplifies an equivalent thermal circuit that includes all possible thermal resistances, where $R_{OPTO\_DEV}(j)$, $R_{TIM}(j)$, $R_{HS}(j)$, and $R_{PACKAGE}(j)$ are j-th optoelectronic device 400B, while $T_{OPTO\_DEV}(j)$, $T_{TIM}(j)$, $T_{HS}(j)$, and $T_{PACKAGE}(j)$ are corresponding operating temperature of j-th optoelectronic device 400B. Since an electrical feedthrough 41 may have 128 pins 42, 1.0-1.5 mm pin-to-pin separation, and 0.1-3.0 A current flowing per pin 42. FIG. 8C simplifies an equivalent thermal circuit that includes only single-pin thermal resistances, where $R_{PIN}(n, m)$, $R_{SEAL}(n, m)$, $R_{HEADER}(n, m)$, and $R_{AMBIENT}(n, m)$ represent pin 42, sealing material bead 43, header 44, and ambient resistances of m-th pin 42 in n-th electrical feedthrough 41, while $T_{PIN}(n, m)$, $T_{TIM}(n, m)$, $T_{HEADER}(n, m)$, and $T_{AMBIENT}(n, m)$ are corresponding operating temperature of m-th pin 42 in n-th electrical feedthrough 41. If $Q_{EF}$ represents the maximum power that needs to be dissipated from a plurality of the electrically powered electrical feedthroughs 41, then the package 100 must be able to accommodate this source of heat for heat dissipation management, namely, $$Q_{EF} = \Sigma_{n=1}^{l} \Sigma_{m=1}^{v} Q(n,m) \text{ and } Q(n) = \Sigma_{m=1}^{v} Q(n,m). \quad (1)$$

where Q(n) is the maximum power that needs to be dissipated from single electrically powered electrical feedthrough 41.

To quantify the heat generated by an electrical feedthrough 41, one can model a single pin 42, as shown in FIG. 6C, with $r_1$ as pin 42 radius, $r_2$ as the sealing material bead 43 outer radius, and l as sealing material bead 43 length. A multi-pin feedthrough 41 structure can be simplified as an effective thermal circuit as shown in FIG. 8C, where the thermal resistances of the sealing material bead 43 and electrical feedthrough assembly 41 are written as:

$$R_{SEAL}(n, m) = \frac{Ln(r_2/r_1)}{\kappa_{SEAL} \cdot 2\pi \cdot l}, \text{ and} \quad (2)$$

$$R_{EF} = \sum_{n=1}^{l} \sum_{m=1}^{v} R_{SEAL}(n, m) \quad r_2 > r_1$$

while the temperature radial distribution inside the seal could be approximately by:

$$T(r) = T_{PIN} + (T_{SEAL} - T_{PIN}) \cdot \frac{\ln\left(\frac{r}{r_1}\right)}{\ln\left(\frac{r_2}{r_1}\right)}, \quad r_2 > r > r_1 \quad (3)$$

In this thermal circuit model, metal conducting pin 42 has its electrical and thermal resistances, $R_{ele}$ and $R_{PIN}$, by:

$$R_{ele}(n, m) = \rho_{PIN}(n, m) \frac{4l}{\pi \phi_{PIN}^2}, R_{PIN}(n, m) = \frac{4l}{\kappa_{PIN}(n, m) \cdot \pi \phi_{PIN}^2} \quad (4)$$

The corresponding maximum power can be expressed by $$P_{PIN}(n, m) = i^2 \cdot R_{ele}(n, m) = \frac{\Delta T_{PIN}(n, m)}{R_{PIN}(n, m)}, \quad (5)$$

where $\phi_{PIN} = 2 \cdot r_1$, $\phi_{SEAL} = 2 \cdot r_2$, $\rho_{PIN}$ and $\kappa_{PIN}$ are resistivity and thermal conductivity of the pin 42 material; $\Delta T_{PIN}$ corresponds to electrical feedthrough 41 temperature rise, generated by electrical current flowing through a pin 42. Equations. (4)-(5) have shown that the thermal resistance induced temperature rise not only depends upon material thermal conductivities ($\kappa_{PIN}$) but also upon pin 42 geometrical parameters ($\phi_{PIN}$ and l) that make an electrical feedthrough 41 assembly. In some embodiments, each feedthrough pin and header seal 47 of an electrical feedthrough 41 of a package 100 may have a high thermal stress resistance against the thermal stress rise for making the electrical feedthrough 41 simultaneously thermal and mechanical stable.

Figure 9A:
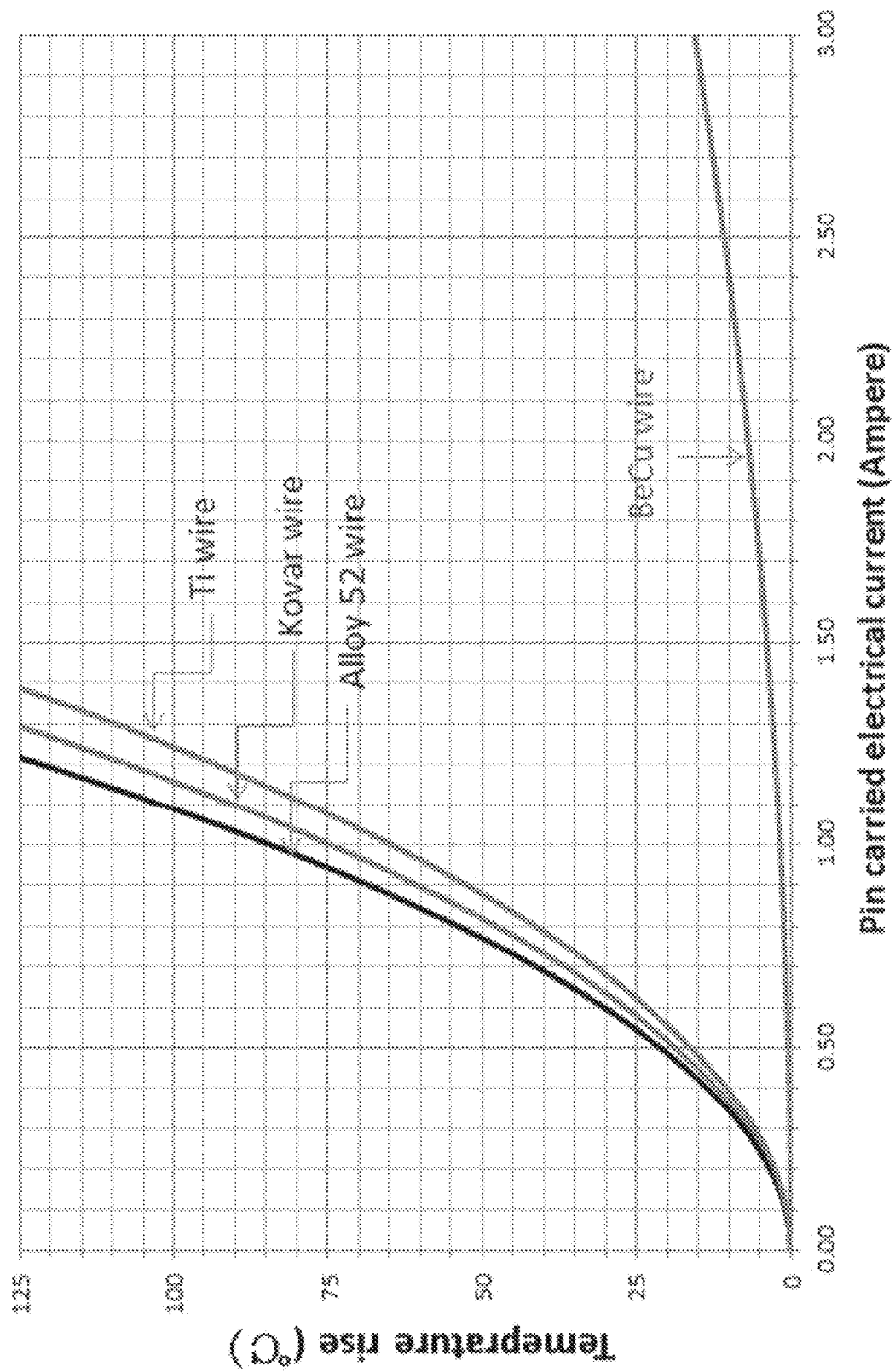
FIG. 9A depicts a graph showing examples of electrically powered multi-pin electrical feedthrough temperature rise with different pin materials according to various embodiments described herein.
Figure 9B:
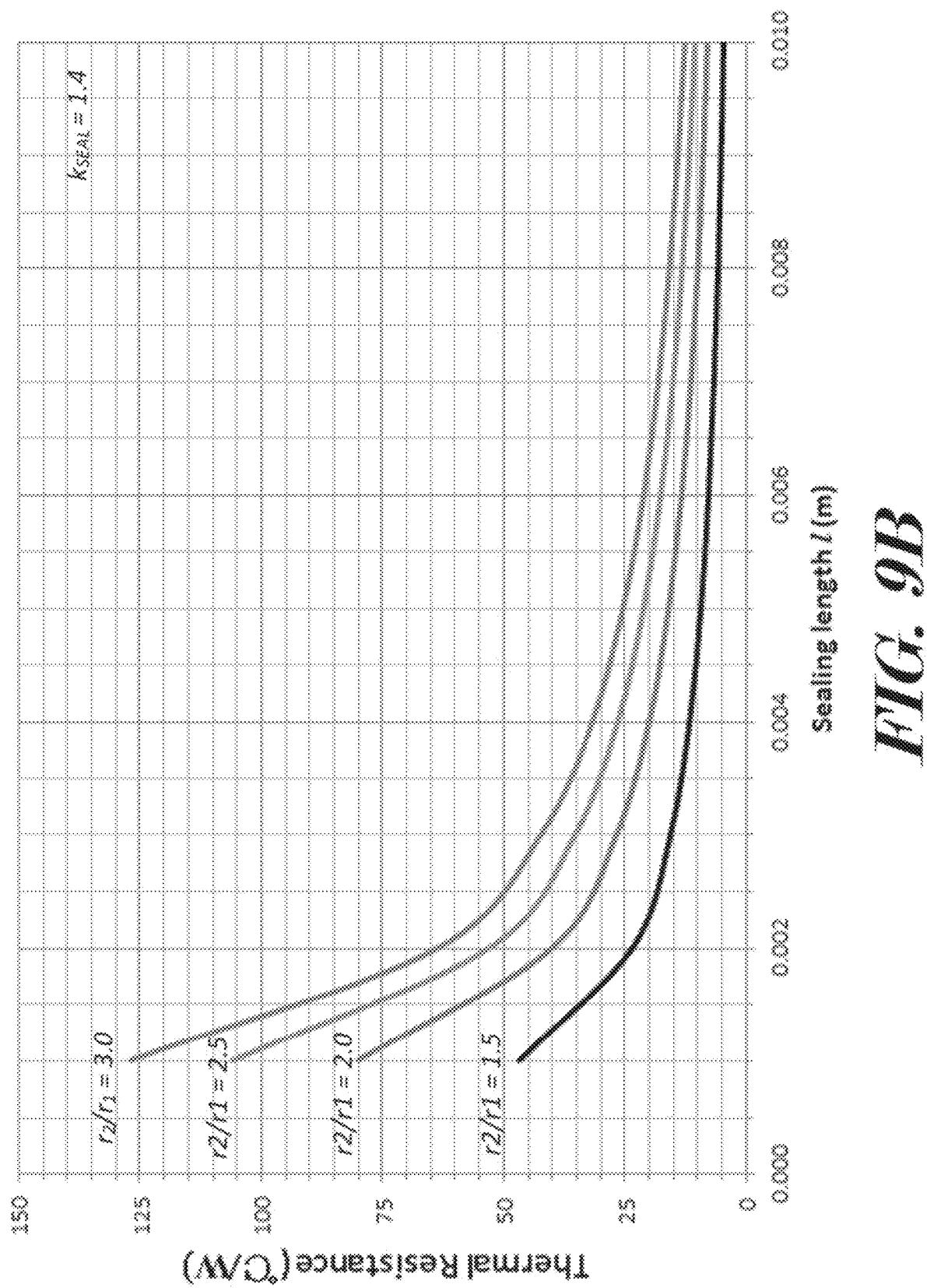
FIG. 9B illustrates a graph showing examples of electrically powered multi-pin electrical feedthrough thermal resistances under different seal geometric parameters according to various embodiments described herein.

FIGS. 9A and 9B show electrically powered multi-pin electric feedthrough 41 temperature rise as a function of pin 42 material and carried current, and how the electrical feedthrough thermal resistance as a function of material geometrical parameters. FIG. 9A has disclosed that high thermal conductive pin 42 material induced electrical feedthrough 41 temperature rise is negligible for a current less than 2.0 A. The nonlinear response of the temperature rise vs electrical current, calculated by several different thermal conducting pin 42 materials with a typical geometry of $\phi$0.50 mm pin diameter and 10 mm pin 42 length, has demonstrated low-thermal-conduction pin 42 material may function as an "extra heat source" that may contribute operating temperature rise of the package 100 of the electrical feedthrough 41. For example, high-conductive BeCu material pin 42 induced temperature rise effect can be ignored if the powered pins 42 only carry a current of less than 2.0 A. However, the thermal effect could become significant if Alloy 52, Kovar, and Ti is used as pin 42 materials, powered with 1.0-1.25 A currents. The localized "temperature rise" around sealing material bead 43 pin and header seal 47 area may reach to 100° C. even with a current of less than 1.5 A as shown in FIG. 9A.

On the other hand, geometrical parameters of an electrical feedthrough assembly 41 can also significantly affect the temperature rise by so-called thermal resistance from pin 42 and the sealing material bead 43 interface area (pin-seal area), as shown in FIG. 9B, where the thermal resistance is proportional to $\ln(r_2/r_1)$ but inversely to sealing length, l. For example, the thermal resistance can be as low as 10° C./W at 4.5 mm sealing length and $r_2/r_1 \approx 1.50$; however, this thermal resistance can be as high as 128° C./W at 1 mm sealing length and $r_2/r_1 \approx 3.0$. Higher thermal resistance will definitely generate more heat than low thermal resistance that is equally to carry low electrical current. Thus, FIG. 9B implies that a lower $r_2/r_1$ may allow high current flowing without causing higher temperature rise at pin 42 and the sealing material bead 43 interface area. In preferred embodiments, the extra heat induced temperature rise may be effectively reduced by thermal resistance of each pin-seal of an electrical feedthrough 41. In further embodiments, each pin and header seal 47 of a package 100 having a low thermal resistance that is determined by geometric parameters of the conducting pin 42 and the sealing material bead 43 material properties resulting in a low-temperature-rise electrical feedthrough assemblies. Moreover, the sealing material bead 43 with pin and seal with longer sealing length more effectively reduce thermal resistance and the temperature rise around feedthrough assembly 41, as seen from FIG. 9B. Of course, the temperature around pin 42, seal, and the sealing material bead 43 will rise whenever the electrically powered feedthrough generated thermal power exceeds its maximum allowed heat dissipation power. A minimum $r_2/r_1$ ratio can be defined by the required maximum operating voltage $\geq \zeta(r_2-r_1)$, where $\zeta$(10 MV/m-100 MV/m) is dielectric strength of the most of glass and ceramic sealing materials.

For a given package 100, the total maximum power that needs to be dissipated from the package exterior surfaces 13, 23, may be calculated by $$Q = \Sigma_{i=1}^{p} Q(i) + \Sigma_{j=1}^{h} Q(j) + \Sigma_{n=1}^{v} \Sigma_{m=1}^{v} Q(n,m), \quad (6)$$

where Q(i) is power loss of i-th integrated electronic device by:

$$Q(i) = \frac{T_{PACKAGE} - T_{AMBIENT}}{R_{INTG-DEV}(i) + R_{TIM}(i) + R_{PANEL}(i) + R_{PACKAGE}}, i = 1, 2, 3, \ldots p \quad (7)$$

and Q(j) is the power loss of j-th optoelectronic device 400B, $$Q(j) = \frac{T_{PACKAGE} - T_{AMBIENT}}{R_{OPTO-DEV}(j) + R_{TIM}(j) + R_{PANEL}(j) + R_{PACKAGE}}, j = 1, 2, 3, \ldots h \quad (8)$$

where the thermal resistance of the thermal conduction panel is calculated by:

$$R_{PANEL} = \sum_{i=1}^{u} \frac{h_i}{\kappa_i \cdot A_i}, \quad (9)$$

where $h_i$ represents the thickness of i-th zone, $\kappa_i$ and $A_i$ are thermal conductivity and area of i-th zone inside the thermal conduction panel (see FIGS. 7A-7E), respectively.

The maximum power of the m-th sealed pin 42 from n-th electrical feedthrough 41 can be described by:

$$Q(n, m) = \frac{T_{PIN}(n, m) - T_{AMBIENT}}{R_{PIN}(n, m) + R_{SEAL}(n, m)}, \quad (10)$$

$$n = 1, 2, 3, \ldots l, m = 1, 2, 3, \ldots v$$

Thus, the package 100 temperature rise, contributed by electrically powered multi-pin electrical feedthroughs 41, can be written as:

$$\Delta T = T_{PACKAGE} - T_{PACKAGE}(0) = Q_{ele} \cdot R_{EF} + Q_{EF} \cdot (R_{ele} + R_{EF}) \quad (11)$$

where $T_{PACKAGE}(0)$ is averaged package operating temperature that doesn't include 'extra heat', generated by a plurality of electrically powered multi-pin electrical feedthroughs 41. In this manner, the extra heat induced temperature rise is effectively reduced by a high-thermal conducting pin 42 material and a geometric parameter ratio of conducting pin 42 and seal diameters and sealing length. In preferred embodiments, a package 100 and/or electrical feedthrough 41 of an electronic package 100 may comprise one or more electrical feedthrough subassemblies 48 each having a pin diameter to seal bead diameter ratio which may be less than 2.0 and more preferably approximately 1.5. In preferred embodiments, a package 100 and/or electrical feedthrough 41 of an electronic package 100 may comprise one or more electrical feedthrough subassemblies 48 each having a sealing length to seal bead diameter ratio which may be greater than 2.0 and more preferably greater than 3.0.

For high-power or high-speed electronic devices 400, the up-limit operating temperature of an integrated electronic device 400 could be between 125° C. and 175° C. in general. For high reliable performance the preferred package 100 operating temperature $T_{PACKAGE}$ is better at less than 50% or 87.5° C. of this up-limit operating temperature. However, if the package 100 temperature rise, $\Delta T$, is not negligible for a package 100 that includes a plurality of electronic devices 400, such as high-power modules or high-speed optoelectronic modules 400B, it will induce the corresponding thermal stress across the pins 42 and seal area. The hermeticity could be lost if such thermal stress amplitude around a pin-seal area exceeds maximum bonding strength between the sealing material bead 43 and the metal header 44 cavity surface. The bonding strength reflects maximum shear bonding strength limit against sealing material of the pin and header seal 47 delaminating from either pin 42 surface or header 44 cavity interior surface by abrupt stress change at the sealing material pin and header seal 47 and metal pin 42 and header 44 surfaces. On the other hand, under small thermal stress case, the hermeticity failure still could occur if the electrically powered pins 42 carry frequently varied currents that cause thermal cycle induced mechanical fatigue of the shear bonding strength between the pin and header seal 47. In preferred embodiments, the thermal stress amplitude in each pin and header seal 47 of an electrical feedthrough 41 may be effectively reduced by long sealing length for making the electrical feedthrough 41 mechanical reliable. In further preferred embodiments, each pin and header seal 47 of an electrical feedthrough 41 may have a high thermal stress resistance thereby making the electrical feedthrough 41 mechanically reliable.

As best shown in FIG. 6B, an electrical feedthrough assembly 41 may comprise a number of electrical feedthrough subassemblies 48, each having a sealing material bead 43 which may be configured as a glass-ceramic hollow cylinder, a metal conducting pin 42 coupled within the sealing material bead 43, and a header 44 that the sealing material bead 43 is bonded by high-temperature firing process to form the pin and header seal 47. The whole electrical feedthrough assembly can be hermetically sealed with the package via a laser welding, solder or brazing process prior to the electronic devices 400 integration. The following description will disclose that this hermetic seal could be lost if thermal stress exceeds its maximum shear bonding strength. As a fact that the mismatched CTE among the sealing material bead 43, pin 42, and header 44 materials will induce radial and hoop stress, that can be expressed by:

$$\sigma_r = \frac{\Delta\sigma_{seal-pin} \cdot \phi_{pin}^2 - \Delta\sigma_{ms-seal} \cdot \phi_{seal}^2 + \phi_{seal}^2 \phi_{pin}^2 (\Delta\sigma_{seal-pin} - \Delta\sigma_{ms-seal})/\phi^2}{(\phi_{gseal}^2 - \phi_{pin}^2)}, \phi_{pin} < \phi < \phi_{seal} \quad (12)$$

$$\sigma_\tau = \frac{\Delta\sigma_{seal-pin} \cdot \phi_{pin}^2 - \Delta\sigma_{ms-seal} \cdot \phi_{seal}^2 - \phi_{seal}^2 \phi_{pin}^2 (\Delta\sigma_{seal-pin} - \Delta\sigma_{ms-seal})/\phi^2}{(\phi_{gseal}^2 - \phi_{pin}^2)}, \phi_{pin} < \phi < \phi_{seal} \quad (13)$$

Figure 10:
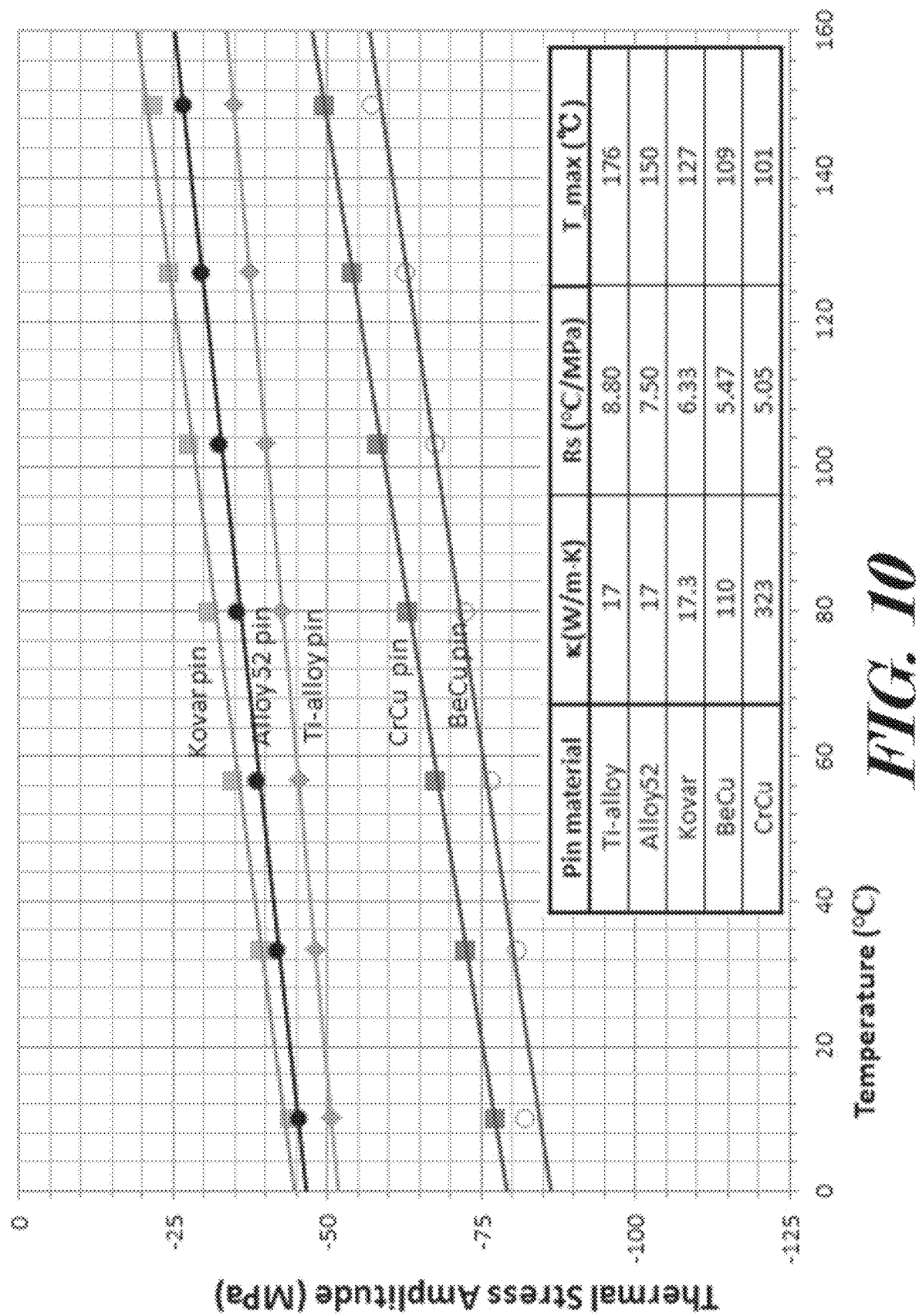
FIG. 10 shows a graph depicting examples of thermal stress amplitude and stress resistance from a Low-CTE Titanium alloy based electrical feedthrough assembly with different pin materials according to various embodiments described herein.
Figure 11:
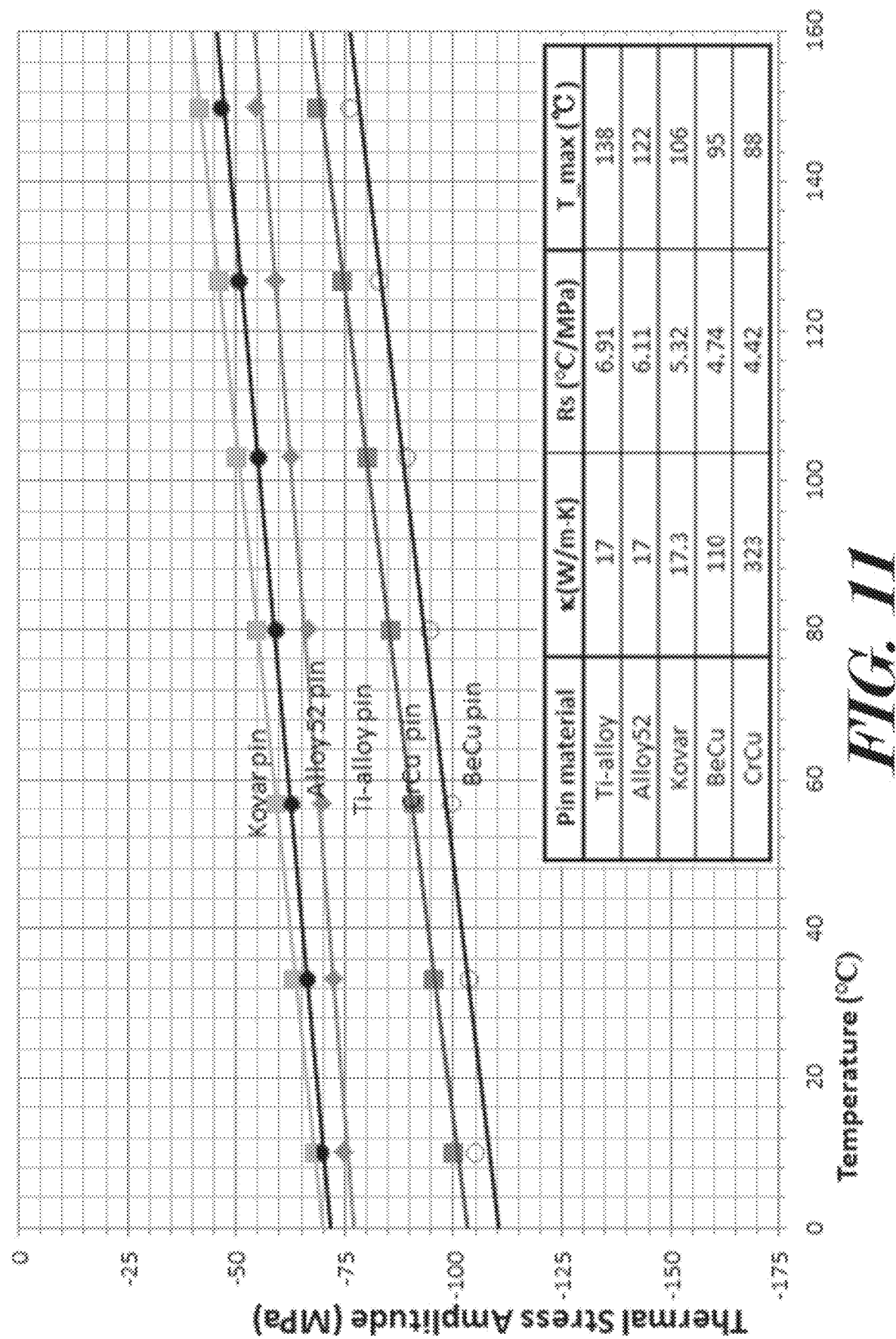
FIG. 11 depicts a graph showing examples of thermal stress amplitude and stress resistance from a high-CTE Aluminum alloy based electrical feedthrough assembly with different pin materials according to various embodiments described herein.

The temperature rise induced thermal stress amplitude can be written as:

$$\sigma_{seal}(T) = \left(\frac{r_2}{2l}\right)\left(\frac{r_2^2 - r_1^2}{2r_2^2}\right)[\Delta\sigma_\tau - \Delta\sigma_r] \cdot (T_{PACKAGE} - T_{PACKAGE}(0)) = \frac{\Delta T}{R_s}, \quad (14)$$

where $R_s$ is the thermal stress resistance of the electrical feedthrough assembly 41, in ° C./MPa, determined by geometric parameters, material properties of the electrical feedthrough assembly 41. For example, the calculation of the radial and hoop stresses will require temperature-dependent material properties in Young's modulus, coefficient of thermal expansion, Poisson's ratio from the sealing material bead 43, pin 42, and header 44 materials. FIG. 13 provides a table that has listed some material properties that are used for thermal stress analyses. FIGS. 10 and 11 illustrate the temperature rise induced thermal stress amplitude and stress resistance with both low-CTE Ti-alloy and high-CTE Al-alloy as header 44 materials, where the sealing material bead 43 and pin 42 diameter are 1.47 mm and 0.64 mm and sealing length (l) of the sealing material bead 43 is 2.16 mm. As disclosed in our previous patent applications (US2018/0331464A1, US2016/004391), a hydrophobic crystalline sealing material may be used, if used in some damping harsh environment, as the sealing material bead 43 for sealing electrical feedthroughs 41 and conducting pins 42 under optimized geometrical parameters with its 60-85 GPa Young's modulus, 5.7-7.30 g/cm$^3$ density, and 6.5-12.5 ppm/° C. CTE.

FIG. 10 discloses that a Ti-alloy (such as Ti Grade 2, 4 and 5) can be used as a header 44 material with CrCu, Kovar, Alloy 52, Ti-alloy, and BeCu as pin 42 materials. Similarly, FIG. 11 also discloses that an Al-alloy (such as Al4032, Al6161, and Al7570) can be used as header 44 material with CrCu, Kovar, Alloy 52, Ti-alloy, and BeCu as pin 42 material. By comparing thermal stress amplitudes and stress resistances from both low-CTE Ti-alloy and high-CTE Al-alloy based electrical feedthroughs 41, it is clear that both Kovar and Ti-alloy pin 42 integrated electrical feedthroughs 41 have relative smallest stress amplitudes but high thermal stress resistances. On the contrary, although high-thermal-conductive CrCu and BeCu pins 42 can carry high electrical current flowing through the electrical feedthrough 41 without induced higher temperature rise, the pin and header seal 47 has not only the high thermal stress amplitude but also low stress resistance, which means the thermal stress is easily generated by package 100 temperature rise. For example, the stress resistance of a Ti-alloy and BeCu based electrical feedthrough assembly 41 is 5.47° C./MPa with about −83 MPa thermal stress amplitude at ambient or 25° C. If maximum glass-ceramic to Ti-alloy metal shear bonding strength, provided either by mechanical or chemical bonding, is about 20 MPa, the maximum operating temperature of the pin and header seal 47 area shouldn't exceed 109.4° C. If normal package 100 operating temperature is about 87.5° C., the temperature rise should be less than 22° C. However, the thermal stress resistance of an Al-alloy and BeCu based electrical feedthrough assembly 41 is 4.74° C./MPa with about −105 MPa thermal stress amplitude at ambient. If maximum glass-ceramic to Al-alloy shear bonding strength is also about 20 MPa, the maximum operating temperature of the pin and header seal 47 should not exceed 95° C. If normal package 100 operating temperature is about 87.5° C., a 7.5° C. temperature rise is potentially allowed. As another example of pin 42 materials that may be used, the thermal stress resistance of an Al-alloy and CrCu based electrical feedthrough assembly 41 is 4.42° C./MPa with about −98 MPa thermal stress amplitude at ambient. If maximum glass-ceramic to Al-alloy metal shear bonding strength is also about 20 MPa, the maximum operating temperature of the pin and header seal 47 area should not exceed 88° C. In this scenario, any extra heat generated by the electrical current flowing through the pin 42 has to be fully removed away. However, whenever the package 100 operating temperature is likely over this limit, other thermal dissipation methods, such as thermal convection or radiation provided by highly emissive coated layer 51 package surfaces, may be required to remove extra heat from the electronic package 100 to guard against any package 100 operating temperature rise.

Figure 12:
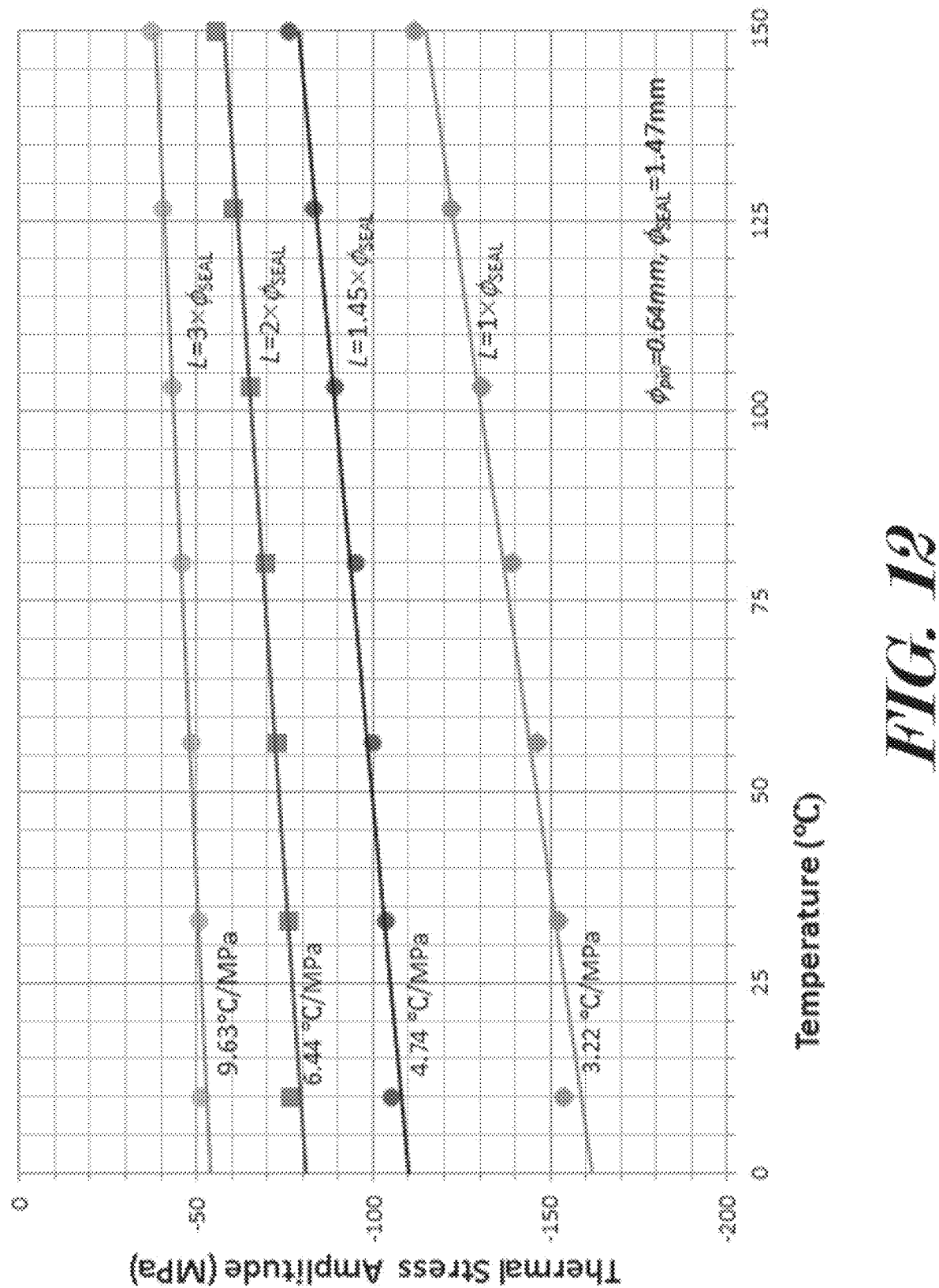
FIG. 12 illustrates a graph showing examples of thermal stress amplitude reduction and thermal stress resistance increase from a high-CTE Aluminum alloy based electrical feedthrough assembly with different sealing lengths according to various embodiments described herein.

To make a high reliable electrical feedthrough 41, it is also preferred that the electrical feedthrough 41 has low thermal stress amplitude for avoiding potential hermeticity failure by mechanical stress at cryogenic or elevated temperatures, because the thermal may cause the electrically powered pins 42 delaminating from the sealing material bead 43 to seal-pin 42 interface by lost bonding strength. By comparing ambient thermal stress amplitudes from Ti-alloy and Al-alloy based electrical feedthroughs 41, it will be preferred to use Kovar, Ti-alloy and Alloy 52 based pins 42 for making high thermal stress resistant electrical feedthroughs 41. FIG. 12 illustrates that both thermal stress amplitude and thermal stress resistance not only depend upon the temperature rise but also can be reduced by longer sealing length (l) of the sealing material bead 43 in an electrical feedthrough assembly 41. As indicated by Al-alloy and BeCu based electrical feedthrough assembly 41 in FIG. 11, the thermal stress amplitude and stress resistance are about −105 MPa with 4.74° C./MPa, at 0.64 mm pin 42 diameter, 1.47 mm the sealing material bead 43 diameter, and 2.16 mm sealing length (l) of the sealing material bead 43. However, with increased sealing length from $1.0 \times \phi_{seal}$ to $3 \times \phi_{seal}$ the corresponding thermal stress amplitude has been effectively reduced by three times under ideal situation. Meanwhile, the thermal stress resistance has also increased 3 times. Especially, at $3 \times \phi_{seal}$ sealing length (l), the ambient thermal stress amplitude is about −50 MPa with 9.63° C./MPa thermal stress resistance that could allow the maximum package 100 operating temperature up to 192.6° C., which is a 97.56° C. increase than a package 100 having an electrical feedthrough 41 with sealing length (l) of $1.47\phi_{seal}$. In other words, the use of a high-conductive pin 42 material, such as BeCu, may require relative longer sealing length (l) to increase thermal stress resistance for mitigating thermal stress induced hermeticity failure; typically, such a thermal stress exceeds the maximum bonding strength provided by ceramic sealing material bead 43 with header 44 or pin 42 surface.

In preferred embodiments, each pin and header seal 47 of the electrical feedthroughs 41 of a package 100 may be configured for >50 KW power delivery having about 3-5° C./MPa thermal resistance for enabling up to 10 amperes current flowing at 5 KV DVC, without causing the package 100 temperature rise up to hermeticity failure temperature limit. In further preferred embodiments, each pin and header seal 47 of the electrical feedthroughs 41 of a package 100 may be configured for greater than 5 KW power delivery in the electrical feedthrough and may have between 7 to 10° C./MPa thermal resistance, and the electrical feedthrough subassembly 48 may have a maximum operating temperature from 150° C. to ~180° C. for enabling up to 1 ampere current flowing at 5 KV DVC, without causing package temperature rise up to hermeticity failure temperature limit.

Except providing thermal stress management for the sealing material bead 43 (electrical feedthrough seal), the integration of a hermetically sealed electronic package 100 has to include a cavity 31 into which all the electronic devices 400 can be sealed inside via a fusion sealing process, such as laser welding seal process under vacuum chamber, of an enclosure 21 and optionally a thermal panel 11. Pre-packed integrated electronic devices 400A and pre-packed optoelectronic devices 400B represent one or more, such as a plurality, of integrated electronic devices 400A and optoelectronic devices 400B that are attached to thermal panel(s) 11 with thermal interface materials 81. An integrated electronic device 400A could represent a high-power module or switching module, such as Mitsubishi intelligent power module having total power dissipation of ~600 W, 0.2 microsecond switching time, and 0.1-10° C./W junction-to-case thermal resistance, and less than 0.02° C./W contact thermal resistance. For a plurality of such high-power or high-speed modules, the power dissipation of a few hundred to thousand Watts should be transported to combined conduction and natural convection. In other embodiments, the total power dissipation may be transported to thermal panels 11 and/or package exterior surfaces 13, 23, as shown in FIGS. 1-4, then to ambient either by thermal conduction or transported to thermal panels 11 and/or package exterior surfaces 13, 23, then to ambient by forced convection.

Referring now to FIGS. 1-4, four examples of packages 100 that integrate electronic devices 400, thermal panel 11, and electrical feedthroughs 41 with low and high thermal conductive enclosures 21 are shown. To effectively assist heat transport from electronic devices 400 to ambient, all the "heat sources or devices" may preferably be attached to thermal conduction panels 11. To ensure the temperature distribution profile is uniformly across surfaces, all electrically powered multi-pin electrical feedthroughs 41 may preferably be symmetrically distributed around package 100. In this manner, the extra heat induced temperature rise from each multi conducting pin electrical feedthrough 41 causes non-uniform temperature distribution across a package 100 and may deteriorate performance of the integrated electronic devices 400 by loss of shear bonding strength. In some embodiments, a thermal panel 11 may be coupled to an enclosure interior surface 22 and/or an enclosure exterior surface 23 via a laser welding process in vacuum environment, via brazing, via soldering, or any other suitable coupling method. In further embodiments, the header 44 of an electrical feedthrough 41 may be coupled to a thermal panel 11 and/or enclosure 21 via a laser welding process in vacuum environment, via brazing, via soldering, or any other suitable coupling method.

In some embodiments, and as shown in FIG. 1, a thermal panel 11 may be attached to an enclosure interior surface 22 with thermal interface material 81 preferably if the package 100 is of high thermal conduction. In this example, the package 100 may comprise a thermal panel 11 having a panel interior surface 12 and a panel exterior surface 13. One or more electronic devices 400 may be coupled to the panel interior surface 12 in thermal communication with the thermal panel 11. An enclosure 21 may be coupled to the thermal panel 11, and the enclosure 21 may have an enclosure interior surface 22 and an enclosure exterior surface 23. A cavity 31 may be formed by the enclosure interior surface 22 and the thermal panel 11 may be disposed within the cavity so that the panel exterior surface 12 may be coupled to the enclosure interior surface 22. One or more electrical feedthroughs 41 may be coupled to the enclosure 21, and each electrical feedthrough 41 may comprise one or more conducting pins 42 which may extend between the enclosure interior surface 22 and enclosure exterior surface 23. In preferred embodiments, each conducting pin 42 in every electrical feedthrough 41 may be bonded by a hydrophobic sealing material bead 43. An emissive coating layer 51 may cover all or portions of the enclosure exterior surface 23. Preferably, one or more getters 61 and/or absorbers 71 may be disposed in the cavity 31.

Figure 2:
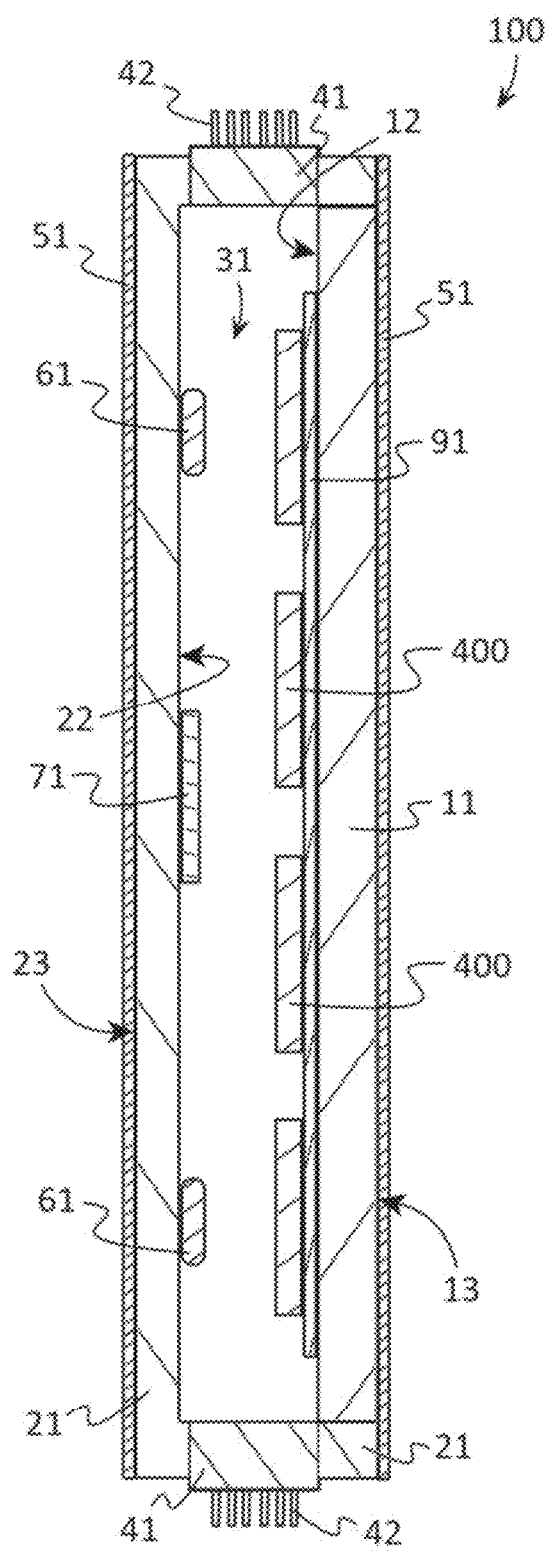
FIG. 2 illustrates a sectional view of another example of a hermetically sealed electronic package according to various embodiments described herein.

In some embodiments, and as shown in FIG. 2, a thermal conduction panel 11 may be coupled, such as by being welded or brazed to package enclosure 21 similar to a lid. In this example, the package 100 may comprise a thermal panel 11 may be coupled to the enclosure 21 so that the enclosure exterior surface 23 and the panel exterior surface 13 may be coupled together and an optional emissive coating layer 51 may be deposited or formed on all or portions of the enclosure exterior surface 23 and the panel exterior surface 13. In this example, the package 100 may comprise a thermal panel 11 having a panel interior surface 12 and a panel exterior surface 13. One or more electronic devices 400 may be coupled to the panel interior surface 12 in thermal communication with the thermal panel 11. An enclosure 21 may be coupled to the thermal panel 11, and the enclosure 21 may have an enclosure interior surface 22 and an enclosure exterior surface 23. The enclosure interior surface 22 may be coupled to the panel interior surface 12 and the enclosure exterior surface 23 may be coupled to the panel exterior surface 13. A cavity 31 may be formed by the enclosure interior surface 22 and the panel interior surface 12. One or more electrical feedthroughs 41 may be coupled to the enclosure 21, and each electrical feedthrough 41 may comprise one or more conducting pins 42 which may penetrating from the enclosure interior surface 22 to the enclosure exterior surface 23. In preferred embodiments, each conducting pin 42 in every electrical feedthrough 41 may be bonded by a hydrophobic sealing material bead 43. An emissive coating layer 51 may cover all or portions of the enclosure exterior surface 23 and all or portions of the panel exterior surface 13. Preferably, one or more getters 61 and/or absorbers 71 may be disposed in the cavity 31.

Figure 3:
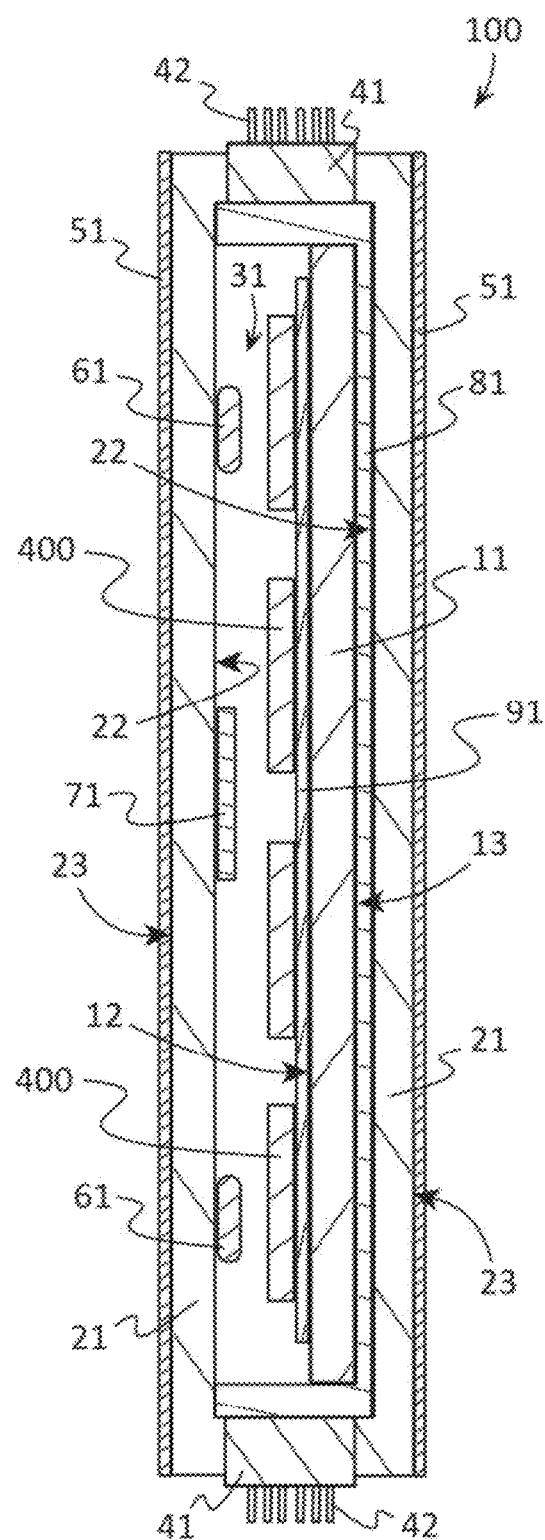
FIG. 3 shows a sectional view of still another example of a hermetically sealed electronic package according to various embodiments described herein.

In some embodiments, and as shown in FIG. 3, a thermal panel 11 may be attached to an enclosure interior surface 22 with thermal interface material 81 that may also contact one or more electrical feedthroughs 41, preferably if the package 100 is of high thermal conduction. In this example, the package 100 may comprise a thermal panel 11 having a panel interior surface 12 and a panel exterior surface 13. One or more electronic devices 400 may be coupled to the panel interior surface 12 in thermal communication with the thermal panel 11 optionally via an electronic substrate 91. An enclosure 21 may be coupled to the thermal panel 11, and the enclosure 21 may have an enclosure interior surface 22 and an enclosure exterior surface 23. A cavity 31 may be formed by the enclosure interior surface 22 and the thermal panel 11 may be disposed within the cavity so that the panel exterior surface 12 may be coupled to the enclosure interior surface 22. One or more electrical feedthroughs 41 may be coupled to the enclosure 21, and each electrical feedthrough 41 may comprise one or more conducting pins 42 which may extend between the enclosure interior surface 22 and enclosure exterior surface 23. A thermal panel 11 may be coupled to an enclosure interior surface 22 via a thermal interface material 81 which may also contact one or more electrical feedthroughs 41 so that the electrical feedthroughs 41 may be in thermal communication with the thermal panel 11. An emissive coating layer 51 may cover all or portions of the enclosure exterior surface 23. Preferably, one or more getters 61 and/or absorbers 71 may be disposed in the cavity 31.

Figure 4:
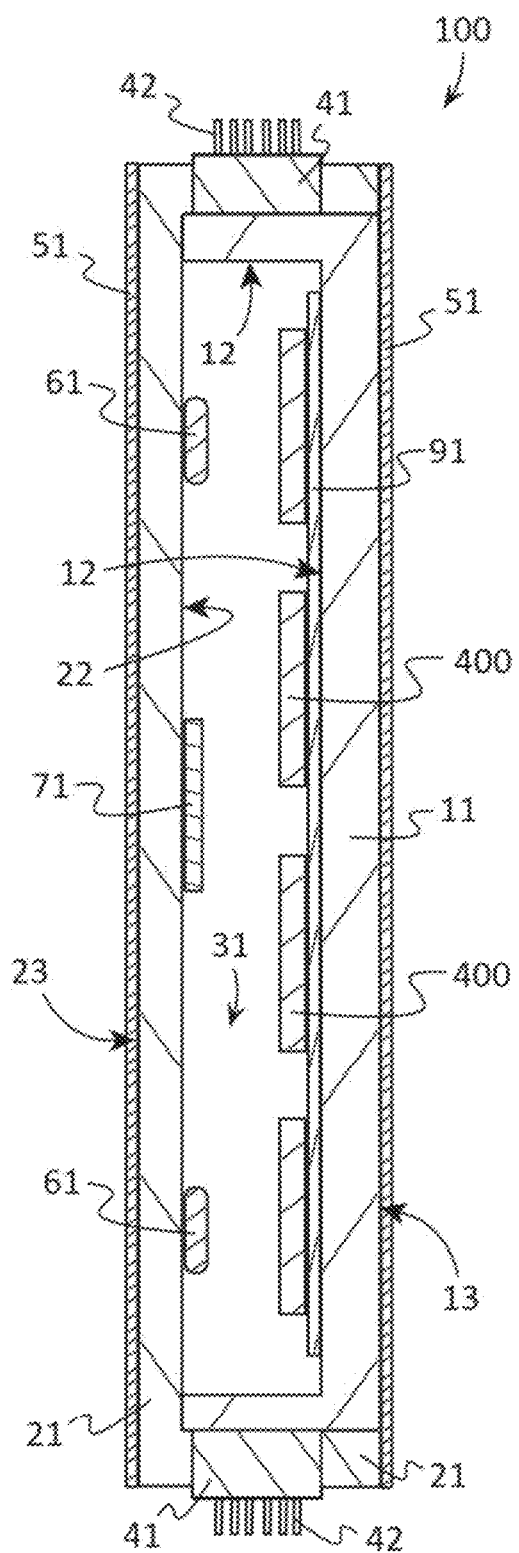
FIG. 4 depicts a sectional view of yet another example of a hermetically sealed electronic package according to various embodiments described herein.

In some embodiments, and as shown in FIG. 4, a thermal conduction panel 11 may be coupled, such as by being welded or brazed to package enclosure 21 similar to a lid. In this example, the package 100 may comprise a thermal panel 11 may be coupled to the enclosure 21 so that the enclosure exterior surface 23 and the panel exterior surface 13 may be coupled together and an optional emissive coating layer 51 may be deposited or formed on all or portions of the enclosure exterior surface 23 and the panel exterior surface 13. In this example, the package 100 may comprise a thermal panel 11 having a panel interior surface 12 and a panel exterior surface 13. Additionally, the thermal panel 11 may be coupled to one or more electrical feedthroughs 41, such as to the header 44 of a respective electrical feedthrough 41, so that the electrical feedthroughs 41 may be in thermal communication with the thermal panel 11. One or more electronic devices 400 may be coupled to the panel interior surface 12, optionally via an electronic substrate 91, in thermal communication with the thermal panel 11. An enclosure 21 may be coupled to the thermal panel 11, and the enclosure 21 may have an enclosure interior surface 22 and an enclosure exterior surface 23. The enclosure interior surface 22 may be coupled to the panel interior surface 12 and the enclosure exterior surface 23 may be coupled to the panel exterior surface 13. A cavity 31 may be formed by the enclosure interior surface 22 and the panel interior surface 12. One or more electrical feedthroughs 41 may be coupled to the enclosure 21, and each electrical feedthrough 41 may comprise one or more conducting pins 42 which may penetrating from the enclosure interior surface 22 to the enclosure exterior surface 23. In preferred embodiments, each conducting pin 42 in every electrical feedthrough 41 may be bonded by a hydrophobic sealing material bead 43. An emissive coating layer 51 may cover all or portions of the enclosure exterior surface 23 and all or portions of the panel exterior surface 13. Preferably, one or more getters 61 and/or absorbers 71 may be disposed in the cavity 31. Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. A hermetically sealed electronic package for electronic devices, the package comprising:
   a thermal panel having a panel interior surface and a panel exterior surface, the electronic devices in thermal communication with the panel interior surface;
   an enclosure coupled to the thermal panel, isolating environmental communication from internal electronic devices and modules; the enclosure having an enclosure interior surface and an enclosure exterior surface;
   a cavity formed by the enclosure interior surface, wherein the panel exterior surface is coupled to the enclosure interior surface;
   at least one electrical feedthrough coupled to the enclosure, the electrical feedthrough having at least one conducting pin penetrating from the enclosure interior surface of a header to the enclosure exterior surface, wherein each pin and header is sealed by a hydrophobic crystalline sealing material;
   a getter disposed in the cavity;
   an absorber disposed in the cavity; and
   an emissive coating layer covering portions of the enclosure exterior surface.

2. The package of claim 1, wherein the enclosure comprises a metal alloy selected from the group consisting of: nickel-cobalt ferrous alloy; titanium alloy; nickel-iron alloy, copper alloy; copper-zinc alloy; and aluminum alloy.

3. The package of claim 1, wherein the thermal panel comprises a metal matrix composite having a thermal conductivity of between 100 W/m·K to 300 W/m·K, the metal matrix composite selected from the group consisting of: silicon carbide particles dispersed in copper matrix material and silicon carbide particles dispersed in aluminum matrix material.

4. The package of claim 3, wherein the metal matrix composite comprises nano-scaled silicon carbide particles, and wherein the metal matrix composite comprises 60 to 70 percent silicon carbide particles to maintain optimum thermal conduction paths by particle grain boundaries.

5. The package of claim 1, wherein the thermal panel comprises a metal matrix composite having a thermal conductivity of between 300 W/m·K to 800 W/m·K, the metal matrix composite selected from the group consisting of: diamond particles dispersed in a copper matrix material, diamond particles dispersed in an aluminum matrix material, and diamond particles dispersed in a silver matrix material.

6. The package of claim 5, wherein the metal matrix composite comprises diamond particles having a size range of between 50 micrometers to 200 micrometers, and wherein the metal matrix composite comprises 55 to 70 percent diamond particles to maintain optimum thermal conduction paths by particle grain boundaries.

7. The package of claim 1, wherein the thermal panel comprises a metal matrix composite having a thermal conductivity of between 600 W/m·K to 800 W/m·K, the metal matrix composite selected from the group consisting of: graphite fibers dispersed in copper matrix material and graphite fibers dispersed in aluminum matrix material.

8. The package of claim 1, wherein the thermal panel comprises a metal matrix composite having a thermal conductivity of between 800 W/m·K to 1200 W/m·K, the metal matrix composite selected from the group consisting of: carbon fibers dispersed in copper matrix material, carbon nanofibers dispersed in copper alloy, carbon fibers dispersed in aluminum alloy, and carbon nanofibers dispersed in aluminum matrix material.

9. The package of claim 1, wherein the getter is configured to absorb a substance selected from the group consisting of: moisture, organic vapor, hydrogen gas, oxygen gas, and nitrogen gas.

10. The package of claim 1, wherein the absorber comprises a RF/MW absorber having an absorbing performance selected from the group consisting of: narrow-band 0.1-6 GHz absorbing performance and wideband 1-100 GHz absorbing performance.

11. The package of claim 1, wherein the electrical feedthrough is in thermal communication with the thermal panel.

12. The package of claim 5, wherein the metal matrix composite comprises diamond particles having a size range of between 50 micrometers to 200 micrometers, and wherein the metal matrix composite comprises 55 to 65 percent diamond particles in the copper matrix material to maintain optimum thermal conduction paths by particle grain boundaries.

13. The package of claim 5, wherein the metal matrix composite comprises diamond particles having a size range of between 50 micrometers to 200 micrometers, and wherein the metal matrix composite comprises 55 to 65 percent diamond particles in the aluminum matrix material to maintain optimum thermal conduction paths by particle grain boundaries.

14. The package of claim 5, wherein the metal matrix composite comprises diamond particles having a size range of between 50 micrometers to 200 micrometers, and wherein the metal matrix composite comprises 60 to 70 percent diamond particles in the silver matrix material to maintain optimum thermal conduction paths by particle grain boundaries.

* * * * *